(12) United States Patent
Ozawa et al.

(10) Patent No.: US 9,806,617 B1
(45) Date of Patent: Oct. 31, 2017

(54) SWITCH MODE POWER CONVERTER WITH OVERSHOOT AND UNDERSHOOT TRANSIENT CONTROL CIRCUITS

(71) Applicant: Dialog Semiconductor (UK) Limited, London (GB)

(72) Inventors: Seiichi Ozawa, Saitama (JP); Naoyuki Unno, Kanagawa (JP); Daisuke Kobayashi, Tokyo (JP)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/260,379

(22) Filed: Sep. 9, 2016

(51) Int. Cl.
*G05F 1/56* (2006.01)
*H02M 3/158* (2006.01)
*H03K 3/0233* (2006.01)
*H02M 1/08* (2006.01)
*H02M 1/00* (2006.01)

(52) U.S. Cl.
CPC ............ *H02M 3/158* (2013.01); *H02M 1/08* (2013.01); *H03K 3/02337* (2013.01); *H02M 2001/0009* (2013.01)

(58) Field of Classification Search
CPC ................................ G05F 1/56; H02M 3/158
USPC .......................................... 323/280–289, 315
See application file for complete search history.

(56) References Cited

U.S. PATENT DOCUMENTS

| 4,199,728 A | 4/1980 | Carpenter | |
|---|---|---|---|
| 6,191,630 B1 * | 2/2001 | Ozawa | H03K 3/0231 |
| | | | 327/172 |
| 6,356,063 B1 | 3/2002 | Brooks | |
| 7,551,460 B2 * | 6/2009 | Lalithambika | H02M 3/33523 |
| | | | 323/286 |
| 7,642,758 B2 * | 1/2010 | Morong | G05F 1/46 |
| | | | 323/206 |
| 7,656,141 B1 * | 2/2010 | Granat | H02M 3/158 |
| | | | 323/284 |
| 7,893,674 B2 * | 2/2011 | Mok | H02M 3/157 |
| | | | 323/283 |

(Continued)

OTHER PUBLICATIONS

"DC-DC Converter With Digital Adaptive Slope Control in Auxiliary Phase for Optimal Transient Response and Improved Efficiency," by Yue Wen et al, IEEE Transactions on Power Electronics, vol. 27, No. 7, Jul. 2012, pp. 3396-3409.

*Primary Examiner* — Adolf Berhane
*Assistant Examiner* — Nusrat Quddus
(74) *Attorney, Agent, or Firm* — Saile Ackerman LLC; Stephen B. Ackerman; Billy Knowles

(57) ABSTRACT

Circuits and methods control output voltage overshoot and undershoot of an SMPC in response to a load current transient. The SMPC control stage has at least one load variation detector that compares a feedback signal with at least one transient threshold level to determine that occurrence of the load current transient. When the load current transient has occurred, the at least one load variation detector causes a switch stage to be turned on to source or sink current to or from the load circuit to compensate the load current transient. A slope detector determines a change in polarity of the slope of the load current transient. When the slope changes polarity, the slope detector sends a signal for preventing an overshoot or an undershoot of the output voltage of the SMPC once the load current transient has been compensated.

33 Claims, 10 Drawing Sheets

(56) References Cited

U.S. PATENT DOCUMENTS

| | | | | |
|---|---|---|---|---|
| 8,164,391 | B2* | 4/2012 | Huynh | H02M 3/1563 |
| | | | | 307/82 |
| 8,169,802 | B2* | 5/2012 | Kim | H02M 1/36 |
| | | | | 323/288 |
| 8,242,762 | B2* | 8/2012 | Bhagwat | H02M 3/1588 |
| | | | | 307/152 |
| 2004/0257055 | A1* | 12/2004 | Aioanei | H02M 3/1588 |
| | | | | 323/282 |
| 2007/0164720 | A1 | 7/2007 | Lalithambika et al. | |
| 2009/0237058 | A1* | 9/2009 | Mulligan | H02M 3/33507 |
| | | | | 323/288 |
| 2010/0039836 | A1* | 2/2010 | Gong | H02M 3/156 |
| | | | | 363/21.13 |
| 2011/0025283 | A1* | 2/2011 | Futamura | H02M 3/1588 |
| | | | | 323/282 |
| 2011/0241642 | A1* | 10/2011 | Xi | H02M 3/1588 |
| | | | | 323/285 |
| 2012/0182003 | A1* | 7/2012 | Flaibani | H02M 3/156 |
| | | | | 323/284 |
| 2012/0223691 | A1 | 9/2012 | Weinstein et al. | |
| 2014/0159686 | A1* | 6/2014 | Lee | H02M 3/156 |
| | | | | 323/282 |
| 2014/0232196 | A1* | 8/2014 | Cameron | G05F 1/67 |
| | | | | 307/82 |
| 2014/0285172 | A1* | 9/2014 | Teh | H02M 3/1588 |
| | | | | 323/285 |
| 2014/0306680 | A1* | 10/2014 | Liu | G05F 1/468 |
| | | | | 323/288 |
| 2015/0355242 | A1* | 12/2015 | Ozawa | H02M 3/1582 |
| | | | | 324/123 R |
| 2016/0359414 | A1* | 12/2016 | Ozanoglu | H02M 3/1582 |
| 2017/0093278 | A1* | 3/2017 | Unno | H02M 3/156 |

* cited by examiner

US 9,806,617 B1

SWITCH MODE POWER CONVERTER WITH OVERSHOOT AND UNDERSHOOT TRANSIENT CONTROL CIRCUITS

TECHNICAL FIELD

This disclosure relates generally to circuits and methods for controlling overshoot and undershoot of the output voltage of a switch mode power converter (SMPC) in response to load transients.

BACKGROUND

One of the present challenges for SMPC's is achieving good load transient response. When the load current increases steeply and drastically, the switch mode power converter must compensate for the lack of the output current as quickly as possible to avoid undershoot of the output voltage of the SMPC. A solution known in the art is transient detector or "panic" comparator within the switch mode power converter for determining that a load transient has occurred. If the transient detector determines that there is an excess output voltage drop at the output of the SMPC, the switching section is activated such that current is allowed to flow into an inductor of the filter section of the SMPC.

FIG. 1 is a schematic of a buck SMPC of the prior art. Referring to FIG. 1, the buck SMPC has a control stage 5, a switch stage 10, filter stage 15. The control stage 5 provides the necessary signals for activating and deactivating the switch stage 10 to control the current $I_{LX}$ applied to the filter stage 15. The control stage 5 has an error amplifier 20 that receives a feedback voltage $V_{FB}$ indicative of the output voltage $V_{OUT}$ from the output terminal 55 of the buck SMPC. A target reference voltage source 35 provides a target reference voltage $V_{REF}$ to a second input of the error amplifier 20. The difference between the feedback voltage $V_{FB}$ and the target reference voltage $V_{REF}$ is used to generate an error signal $V_{ERR}$ indicative of a difference between the output voltage $V_{OUT}$ of the SMPC and the target reference voltage $V_{REF}$. The target reference voltage $V_{REF}$ is a design voltage level for the output voltage $V_{OUT}$ of the SMPC and thus the control stage 5 is structured to minimize the error signal $V_{ERR}$.

The output of the error amplifier 20 is connected to the input of the pulse width modulation (PWM) generator section 25. The PWM generator section 25 includes a PWM comparator 27 and a ramp generator 29. The PWM comparator 27 receives the error signal $V_{ERR}$ at a noninverting input and a ramp clocking signal as created by the ramp generator 29 at the inverting input. The PWM comparator 27 compares the error signal $V_{ERR}$ and the ramp clocking signal and generates a digital PWM signal $V_{PWM}$ at the output of the PWM comparator 27. When error signal $V_{ERR}$ applied to the noninverting (+) input of the comparator is less than the ramp clocking signal applied to the inverting (−) input, the digital PWM signal $V_{PWM}$ will be logical (0). As soon as the ramp clocking signal becomes larger than the error signal $V_{ERR}$, the digital PWM signal $V_{PWM}$ will be logical (1). The ramp clocking signal generates the digital PWM signal $V_{PWM}$ that has a pulse width proportional to Vout at equilibrium condition and is based the error signal $V_{ERR}$. If there is a very light load current $I_{LOAD}$, the duty cycle of the digital PWM signal $V_{PWM}$ is relatively small.

If a load transient causes a significant increase in the load current $I_{LOAD}$, the digital PWM signal $V_{PWM}$ must increase its duty cycle very quickly. To assist in this a panic comparator 40 is added to the control stage 5. The panic comparator 40 is connected to a negative terminal of the undershoot threshold voltage source 45. The positive terminal of the undershoot threshold voltage source 45 is connected to the positive terminal of the target reference voltage source 35. The combination of the undershoot voltage source 45 and the target reference voltage source 35 sets the undershoot threshold voltage level $V_{THUS}$ at the noninverting terminal (+) of the panic comparator 40 at a voltage level of the target reference voltage $V_{REF}$ less the undershoot threshold voltage level $V_{THUS}$ generated by the undershoot voltage source 45.

The inverting terminal (−) of the panic comparator 40 receives the feedback voltage $V_{FB}$ for comparison with the undershoot threshold voltage level $V_{THUS}$. The panic voltage $V_{PANIC}$ of the panic comparator 40 is activated to a logical (1) when the feedback voltage $V_{FB}$ is less than the undershoot threshold voltage level $V_{THUS}$.

The pulse width modulation output PWM of the $V_{PWM}$ comparator 27 and the panic voltage $V_{PANIC}$ of the panic comparator 40 are applied to logical OR circuit 30. The output of the logical OR circuit 30 is the input to the driver circuit 50. The driver circuit 50 conditions the output signal of the logical OR circuit 30 for driving the gates of the PMOS transistor P1 and the NMOS transistor N1. The source of the PMOS transistor P1 is connected to the input voltage $V_{IN}$ of the buck SMPC. The source of the NMOS transistor N1 is connected to the ground reference voltage source. The drains of the PMOS transistor P1 and the NMOS transistor N1 are connected to the input of the filter circuit 15 and thus to a first terminal of an inductor LX. The activation and deactivation of the PMOS transistor P1 and the NMOS transistor N1 determines the direction of the output current $I_{LX}$ of the switch stage 10 which determines the output voltage level $V_{AX}$ of the switch circuit 10. The inductor LX and the load filter capacitor $C_L$ filter the high frequency signals and noise from the output voltage $V_{LX}$ to generate the output voltage $V_{OUT}$ of the buck SMPC at the output terminal 55.

FIG. 2 is a plot of the voltage and current waveforms developed within the buck SMPC of the prior art of FIG. 1. When the load current $I_{LOAD}$ increases precipitously at the time $\tau_1$, the output voltage $V_{OUT}$ begins to fall since the duty cycle of the output of the driver circuit 50 is not large enough to support the level of the load current $I_{LOAD}$. When the output voltage $V_{OUT}$ has decreased to the undershoot threshold voltage level $V_{THUS}$ at the time $\tau_2$, the panic comparator 40 is activated and the panic voltage $V_{PANIC}$ rises to the voltage level of the logical (1). The logical (1) voltage level of the panic voltage $V_{PANIC}$ is transferred through the logical OR circuit 30 and the driver circuit 50 to turn on the PMOS transistor P1. The voltage $V_{LX}$ at the junction of the drains of the PMOS transistor P1 and the NMOS transistor N1 rises at the time $\tau_2$. This causes the current $I_{LX}$ through the inductor LX to increase. At the time $\tau_3$, the inductor current $I_{LX}$ is equal to the load current $I_{LOAD}$ and the slope of the output voltage $V_{OUT}$ changes from negative (decreasing voltage) to positive (increasing voltage). The panic voltage $V_{PANIC}$ remains at the logical (1) level, since the output voltage $V_{OUT}$ remains less than the undershoot threshold voltage level $V_{THUS}$ and thus the PMOS transistor P1 remains turned on and conducting the current $I_{LX}$ into the inductor LX. At the time $\tau_4$, the output voltage $V_{OUT}$ increases to pass the undershoot threshold voltage level $V_{THUS}$ and the panic comparator 40 is deactivated to cause the panic voltage $V_{PANIC}$ to fall to the voltage level of the logical (0). The logical (0) voltage level of the panic voltage $V_{PANIC}$ is transferred through the logical OR circuit 30 and the driver circuit 50 to turn off the PMOS transistor P1. Because of the timing of the ramp clocking signal from the ramp generator 29, the PMOS transistor P1 remains turned on past the time $\tau_4$ thus permitting the inductor current $I_{LX}$ to continue to rise until the end of the cycle of the ramp clocking signal at the time $\tau_5$. At the time $\tau_6$, the output voltage $V_{OUT}$ passes the target reference voltage level $V_{REF}$ and begins to overshoot the desired output voltage $V_{OUT}$. The excessive inductor current $I_{LX}$ causes the output voltage $V_{OUT}$ of the buck SMPC to have a large overshoot between the time $\tau_6$ and the time $\tau_7$ when the pulse width modulation generator 25 regains control. The large overshoot of the output voltage $V_{OUT}$ caused by the excessive inductor current $I_{LX}$ is undesirable impacting the performance of the electronic load circuit 60.

SUMMARY

An object of this disclosure is to provide circuits and methods for controlling overshoot and undershoot of the output voltage of a switch mode power converter (SMPC) in response to very large and rapid variations in load current.

To accomplish at least this object, a control stage of a SMPC has load increase detector connected to sense a large and rapid current transient at an output of the SMPC. The load increase detector has a first input connected to receive a feedback signal indicative of an output voltage of the SMPC. A second input of the SMPC is connected to receive an undershoot threshold level. The load increase detector is configured for comparing the feedback signal with the undershoot threshold to determine that a large, rapid load current variation has occurred. When the feedback signal has exceeded the undershoot threshold, the load increase detector is activated to cause a switch stage to be turned on to provide current through a filter stage of the SMPC to the load circuit to compensate the large, rapid load current variation.

The control stage has a slope detector connected to sense a slope of the large and rapid current transient at an output of the SMPC and configured for determining a change in polarity of the slope of the large and rapid current transient for preventing an overshoot of the output voltage of the SMPC once the large and rapid current transient has been compensated. The slope detector has a first input connected to receive a feedback signal indicative of an output voltage of the SMPC. A second input of the slope detector is connected to receive a target reference voltage level. The slope detector is configured for determining a change in a slope of a change in the difference between the feedback signal and the target reference voltage level.

The slope detector has a differentiator that is configured for generating a difference signal indicating the difference between the feedback signal and the target reference voltage level. The differentiator has a preamplifier that is configured for amplifying the difference signal. An in-phase version of the amplified difference signal is applied to a first terminal of a first capacitor of the differentiator and an out-of-phase version of the amplified difference signal is applied to a first terminal of a second capacitor of the differentiator. A second terminal of the first capacitor is connected to an in-phase terminal of a clocked comparator for transferring the in-phase difference signal to the in-phase terminal of the comparator. A second terminal of the second capacitor is connected to an out-of-phase terminal of the comparator for transferring the out-of-phase difference signal to the out-of-phase terminal of the clocked comparator. The clocked comparator has a clock signal applied to a clock terminal for capturing and latching the state of the inputs of the clocked comparator at specific clock intervals. The comparator is configured for determining if the in-phase difference signal is greater than or less than out-of-phase difference signal.

The slope detector has a first NMOS transistor with a drain connected to a junction between the second terminal of the first capacitor and the in-phase terminal of the clocked comparator. The slope detector has a second NMOS transistor with a drain connected to a junction between the second terminal of the second capacitor and the out-of-phase terminal of the clocked comparator. The gates of first and second transistors are connected to a zeroing signal and the sources of the first and second transistors are connected to the ground reference voltage source. When an undershoot occurs, the difference between the target reference voltage level increases. The slope detector then detects a negative slope with the undershoot. When the switch stage is activated, the change is the difference begins to decrease until the slope become positive. At which time, the slope detector detects a positive slope and the output of the slope detector is activated to indicate the positive slope. The switch stage is then deactivated from providing current to the load circuit and control stage set the duty cycle of the switch stage to allow standard pulse width modulation for the operating conditions.

In some embodiments, the control stage of the SMPC has a logical control gate that is activated when the load increase detector activated and is deactivated when the slope detector is activated. The output of the logical control gate is logically combined with an output of a pulse width modulation circuit for controlling the switching stage of the SMPC.

In various embodiments, the control stage of a SMPC has a load decrease detector connected to sense a large and rapid current transient at an output of the SMPC. The load decrease detector has a first input connected to receive a feedback signal indicative of an output voltage of the SMPC. A second input of the load decrease detector is connected to receive an overshoot threshold level. The load decrease detector is configured for comparing the feedback signal with the overshoot threshold to determine that a large, rapid load current decrease has occurred. When the feedback signal has exceeded the overshoot threshold, the load decrease detector is activated to cause a switch stage to be turned off to cease providing current through a filter stage of the SMPC to the load circuit to compensate to the large, rapid load current decrease.

In various embodiments, the control stage of the SMPC has a panic control circuit connected for receiving the output of the load increase detector, the load decrease detector, and the slope detector to determine the activation and deactivation of the switch stage to control the flow of current into and out of the filter stage of the SMPC.

In various embodiments that accomplish at least the object of this disclosure, an SMPC includes a control stage as described above.

In various embodiments, the slope detector includes a differentiator and a comparator. The differentiator is connected for receiving the feedback signal. From the feedback signal the differentiator is configured for creating a slope signal such that the amplitude of the slope signal is indicative of a slope of the output voltage. The comparator is in communication with the differentiator for receiving slope signal. The comparator is configured for determining when the slope of the output voltage changes polarity based on the amplitude of slope signal. The change in polarity of the slope of the output voltage is determined by whether the slope signal is greater than or less than a zero slope voltage level.

The output of the comparator is a slope polarity signal that is transferred to the differentiator.

The differentiator includes a differentiating capacitor having a first terminal connected to receive the feedback signal. A transconductance amplifier has an input terminal connected to a second terminal of the differentiating capacitor for receiving an input current proportional to the differentiation of the feedback signal versus time. The transconductance amplifier is configured for transforming the input current to slope signal at an output terminal. A feedback resistor has a first terminal connected to the output of the transconductance amplifier and a second terminal connected to the second terminal of the differentiating capacitor and the input terminal of the transconductance amplifier. The feedback resistor develops the amplitude of the slope signal based on the input current.

The comparator is connected to receive the slope signal from the differentiator comparator. The comparator is configured as a Schmitt trigger circuit for determining when the slope signal and thus the slope of the feedback signal is positive or negative relative to the zero slope voltage level and generates the slope polarity signal.

In other embodiments that accomplish at least the object of this invention, a method for operating an SMPC begins by monitoring for very large, rapid load current increases or decreases. The very large, rapid load current increases or decreases cause undershoot and overshoot respectively in the output voltage of the SMPC as applied to the load circuit. When a large undershoot or overshoot occurs, the type of very large, rapid load current increase or decrease is determined. If the output voltage of the SMPC has a very large, rapid decrease or undershoot, the output voltage is compared to an undershoot threshold voltage. If the output is more negative than the undershoot threshold voltage, the switching stage is activated to turn on a first switch to transfer current to the load circuit to increase the load current capacity of the SMPC. Alternately, if the output voltage of the SMPC has a very large, rapid increase or overshoot, the output voltage is compared to an overshoot threshold voltage. If the output is more positive than the overshoot threshold voltage, the switching stage is activated to turn on a second switch to transfer current from the load circuit to decrease the load current capacity of the SMPC.

The polarity of the slope of in the output voltage is monitored. The change in the slope is evaluated to determine the change in polarity. If the changes in polarity of the slope of in the output voltage is from negative to positive the first switch in the switch stage is deactivated to stop additional current from flowing to the inductor of the filter stage to prevent an overshoot. If the changes in polarity of the slope of in the output voltage is from positive to negative the second switch in the switch stage is deactivated to stop additional current from flowing from the inductor of the filter stage to prevent an undershoot. The normal pulse width modulation operation of the SMPC is activated and the method is ended.

DETAILED DESCRIPTION

The purpose of a control stage of a SMPC of this disclosure is to solve one of the most challenging issues for transient loads in SMPC's operating in a pulse frequency modulation (PFM) mode or "sleep mode". The PFM mode is often implemented for energy savings in the SMPC circuits of portable devices. It is activated when the load current is very small. The switch stage is disabled and the switching transistors are turned off for until the output voltage decreases and reaches the target reference voltage level that acts as a threshold for activating the switch stage activated and transfers a current pulse from the input power source to restore the voltage level of the output voltage. The switching stage is then disabled and the operation continues repetitively during the small load condition.

When a rapid load increase occurs during the disabled state, it is the most challenging issue to be managed by the control stage. The control stage must sense the onset of a large, rapid increase or decrease in the current supplied to an electronic load. The control stage must respond so as to prevent very large undershoots or overshoots of the output voltage of the SMPC. To prevent a large overshoot resulting from activating the switch stage of the SMPC to provide increased current to the load resulting from a large, rapid increase in load current, the control stage monitors the slope of the output voltage. When the slope of in the output voltage of the SMPC resulting from activation of the switch stage changes from a negative slope to a positive slope, the switch stage of the SMPC is deactivated. To prevent a large undershoot resulting from activating the switch stage of the SMPC to provide decreased current to the load resulting from a large, rapid decrease in load current, the control stage monitors the slope of the output voltage. When the slope in the output voltage of the SMPC resulting from deactivation of the switch stage changes from a positive slope to a negative slope, the switch stage of the SMPC is activated.

Figure 1:
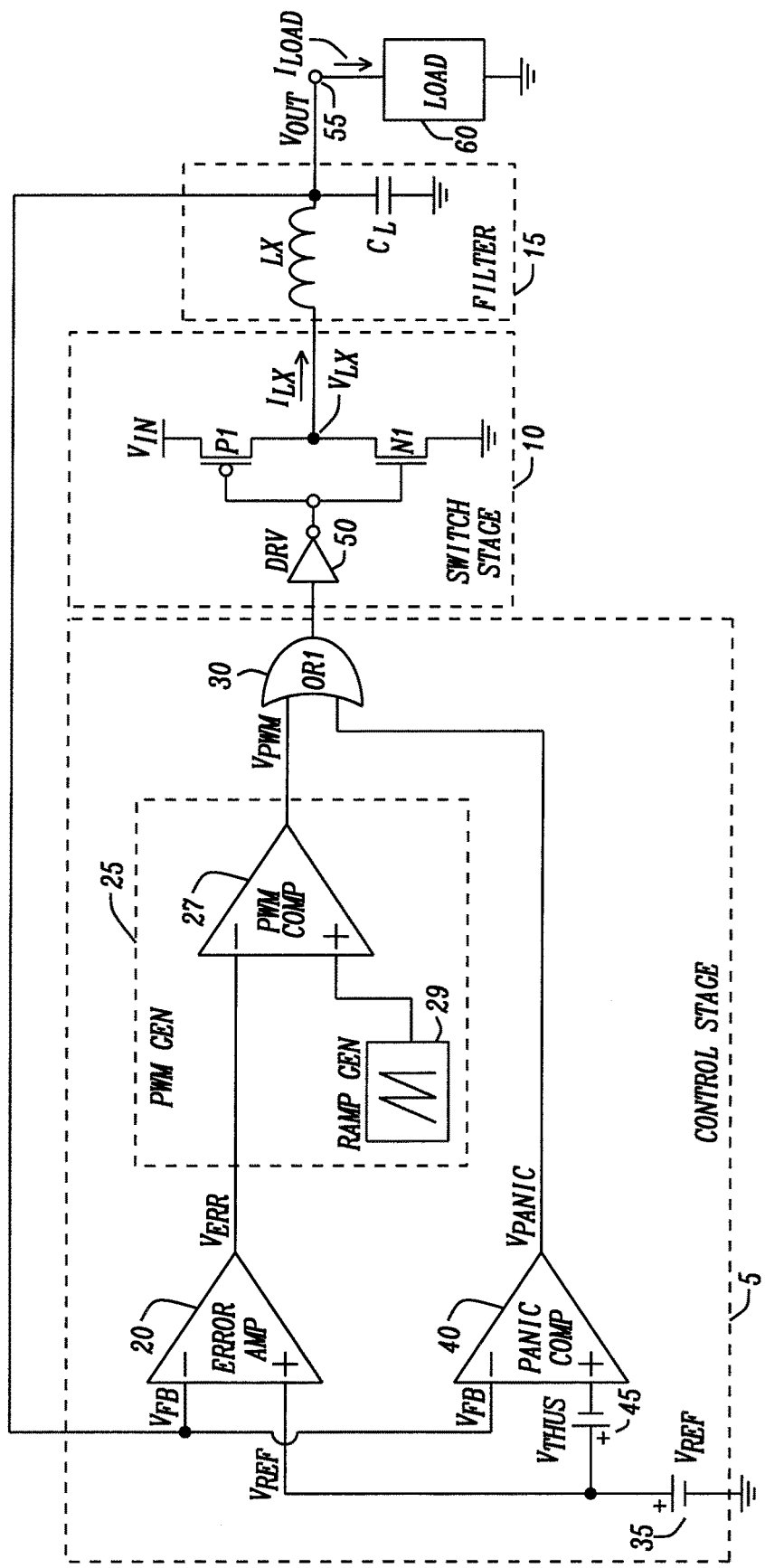
FIG. 1 is a schematic of a buck SMPC of the prior art.
Figure 3:
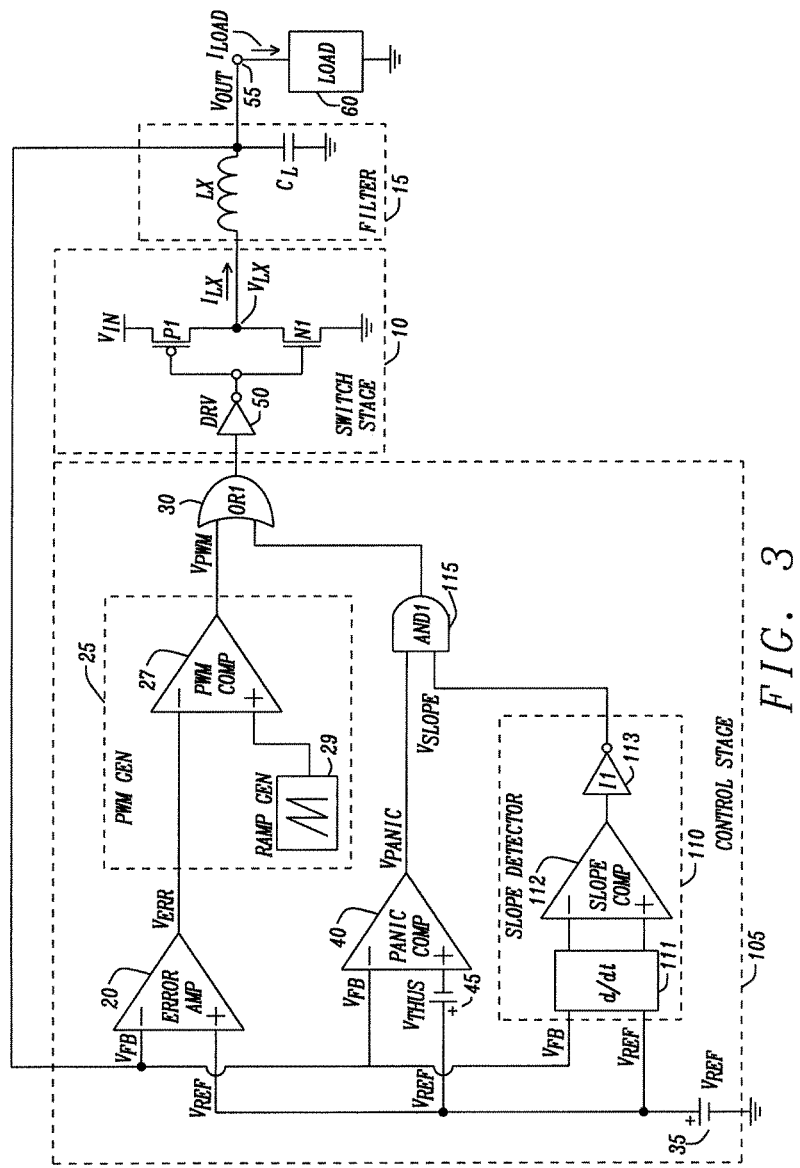
FIG. 3 is a schematic of a buck SMPC embodying the principals of the present disclosure.

FIG. 3 is a schematic of a buck SMPC embodying the principals of the present disclosure. The buck SMPC has a control stage 105, a switch 10, filter 15. The switch stage 10 and the filter stage 15 are identical in structure and function as shown in FIG. 1. The control stage 105 provides the necessary signals for activating and deactivating the switch stage 10 to control the current $I_{LX}$ applied to the filter stage 15. The control stage 105 has an error amplifier 20 that is structured and functions as shown in FIG. 1. The error amplifier 20 receives a feedback voltage $V_{FB}$ indicative of the output voltage $V_{OUT}$ of the buck SMPC that receives a feedback voltage $V_{FB}$ from the output terminal 55 of the buck SMPC. A target reference voltage source 35 provide a target reference voltage $V_{REF}$ to a second input of the error amplifier 20. The difference between the feedback voltage $V_{FB}$ and the target reference voltage $V_{REF}$ is used to generate an error signal $V_{ERR}$ indicative of a difference between the output voltage $V_{OUT}$ of the SMPC and the target reference voltage $V_{REF}$. The target reference voltage $V_{REF}$ is a design voltage level for the output voltage $V_{OUT}$ of the SMPC and thus the control stage 5 is structured to minimize the error signal $V_{ERR}$.

The output of the error amplifier 20 is connected to the input of the pulse width modulation (PWM) generator section 25 that is structured and functions as shown in FIG. 1. The PWM generator section 25 includes a PWM comparator 27 and a ramp generator 29. The PWM comparator 27 receives the error signal $V_{ERR}$ at a noninverting input and a ramp clocking signal as created by the ramp generator 29 at the inverting input. The PWM comparator 27 compares the error signal $V_{ERR}$ and the ramp clocking signal and generates a digital PWM signal $V_{PWM}$ at the output of the PWM comparator 27. When error signal $V_{ERR}$ applied to the noninverting (+) input of the comparator is less than the ramp clocking signal applied to the inverting (−) input, the digital PWM signal $V_{PWM}$ will be logical (0). As soon as the ramp clocking signal becomes larger than the error signal $V_{ERR}$, the digital PWM signal $V_{PWM}$ will be logical (1). The ramp clocking signal generates the digital PWM signal $V_{PWM}$ that has a pulse width based on the amount of load current $I_{LOAD}$ applied to the load circuit 60. If there is a very light load current $I_{LOAD}$, the duty cycle of the digital PWM signal $V_{PWM}$ is relatively small.

If a load transient causes a significant increase in the load current $I_{LOAD}$, the digital PWM signal $V_{PWM}$ must increase its duty cycle very quickly. To assist in this a panic comparator 40 is added to the control stage 5. The panic comparator 40 is connected to a negative terminal of the undershoot threshold voltage source 45. The positive terminal of the undershoot threshold voltage source 45 is connected to the positive terminal of the target reference voltage source 35. The combination of the undershoot voltage source 45 and the target reference voltage source 35 sets the undershoot threshold voltage level $V_{THUS}$ at the noninverting terminal (+) of the panic comparator 40 at a voltage level of the target reference voltage $V_{REF}$ less the undershoot threshold voltage level $V_{THUS}$ generated by the undershoot voltage source 45.

The inverting terminal (−) of the panic comparator 40 receives the feedback voltage $V_{FB}$ for comparison with the undershoot threshold voltage level $V_{THUS}$. The panic voltage $V_{PANIC}$ of the panic comparator 40 is activated to a logical (1) when the feedback voltage $V_{FB}$ is less than the undershoot threshold voltage level $V_{THUS}$.

Figure 2:
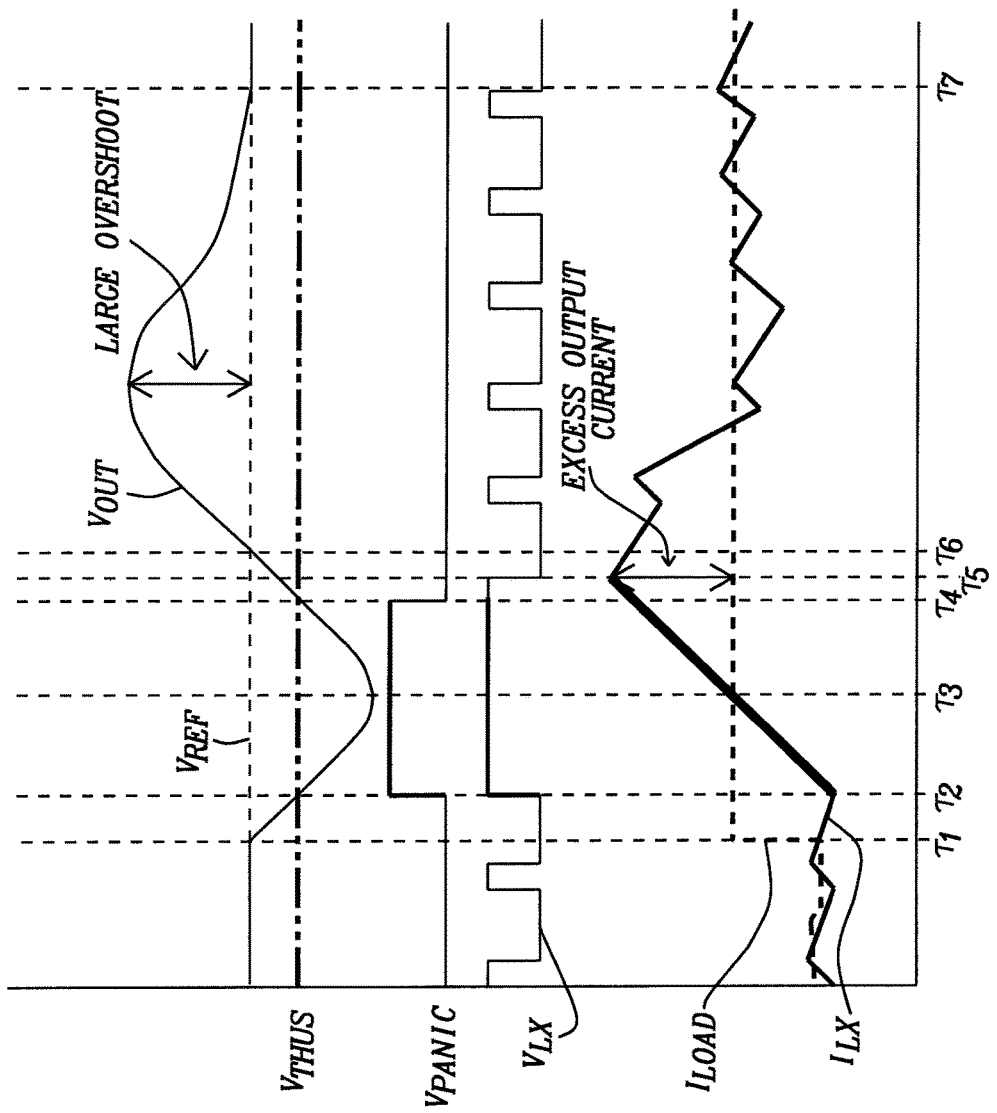
FIG. 2 is a plot of the voltage and current waveforms developed within the buck SMPC of the prior art of FIG. 1.

As shown in FIG. 2, the panic comparator 40 senses the undershoot of the output voltage $V_{OUT}$, when the feedback voltage $V_{FB}$ is less than the undershoot threshold voltage level $V_{THUS}$ at the time $\tau_2$ and the PMOS transistor P1 is turned on to conduct the current LX through the inductor to the electronic load 60 to satisfy the increased load current $I_{LOAD}$. At the time $\tau_6$, the output voltage $V_{OUT}$ passes the target reference voltage level $V_{REF}$ and begins to overshoot the desired output voltage $V_{OUT}$. The excessive inductor current $I_{LX}$ causes the output voltage $V_{OUT}$ of the buck SMPC to have a large overshoot between the time $\tau_6$ and the time $\tau_7$ when the pulse width modulation generator 25 regains control.

To compensate for the large overshoot starting at the time $\tau_6$, the control stage 105 has a slope detector 110. The slope detector 110 has a first terminal that is connected to receive the feedback voltage $V_{FB}$ and a second terminal that is connected to receive the target reference voltage $V_{REF}$. The slope detector 110 is configured to detect when the slope of the feedback voltage $V_{FB}$ and thus the output voltage $V_{OUT}$ of the SMPC changes from a negative slope to a positive slope indicating that the output voltage $V_{OUT}$ is being restored to be equal to the target reference voltage $V_{REF}$. The output of the slope detector 110 is activated to indicate that the PMOS transistor P1 switch stage is to be turned off.

The slope detector 110 has a differentiator 111 that determines a difference between the feedback voltage $V_{FB}$ and the target reference voltage $V_{REF}$. The differentiator 111 then creates an in-phase difference signal and an out-of-phase difference signal indicating the differentiation between the feedback voltage $V_{FB}$ and the target reference voltage $V_{REF}$ per unit of time. The differentiator 111 generates the difference signal according to the equations: V d(Vfb−Vref)/dt. The in-phase and the out-of-phase difference signals are applied respectively to the in-phase terminal (+) and out-of-phase terminal (−) of the slope comparator 112. The output of the slope converter 112 is applied to an inverter 113 to invert the active state of the slope converter 112 so that the active state will satisfy the logical AND 115 for operation.

Figure 4:
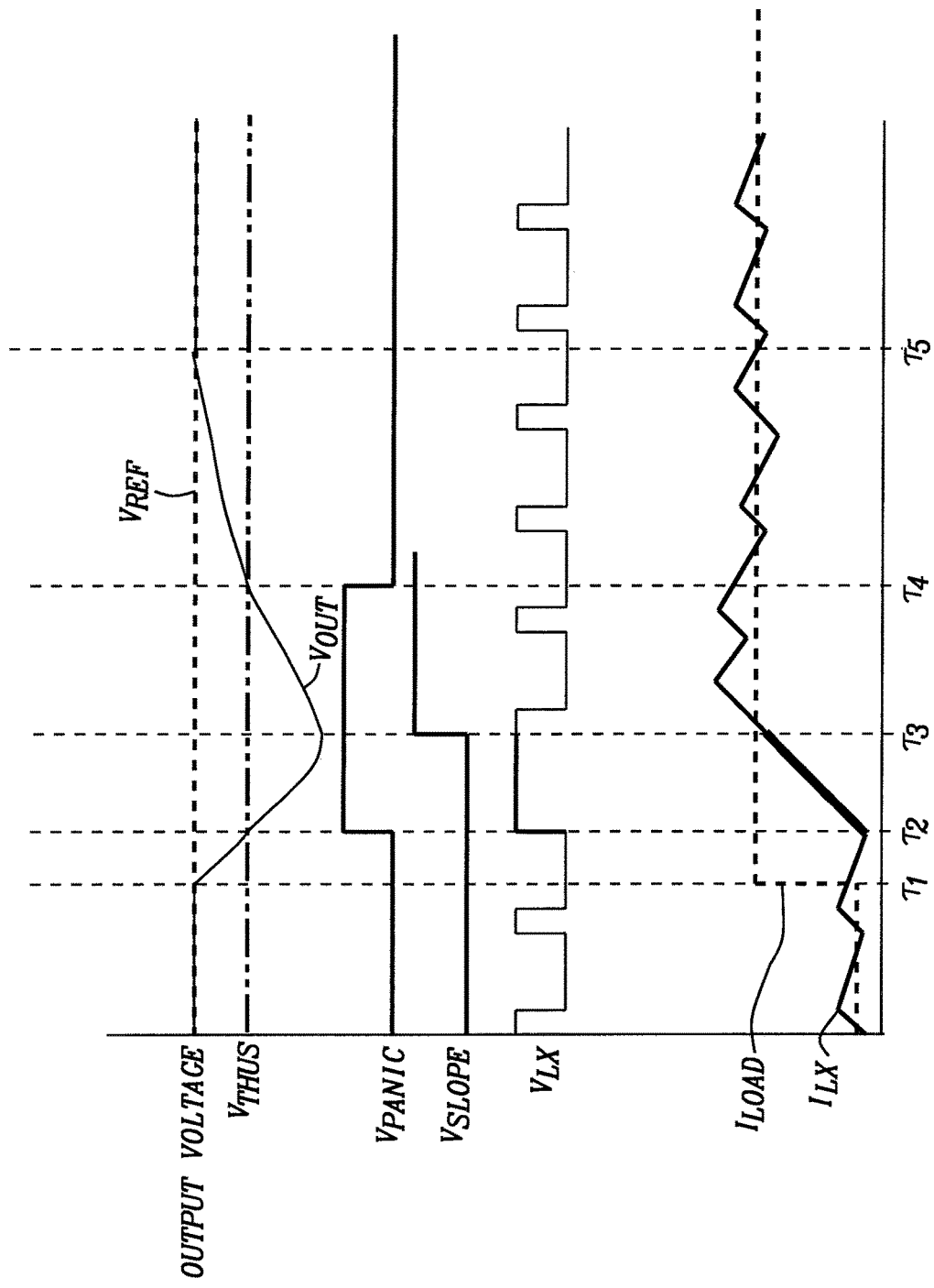
FIG. 4 is a plot of the voltage and current waveforms developed within the buck SMPC embodying the principals of the present disclosure of FIG. 3 for a very large rapid increase in the load current.

FIG. 4 is a plot of the voltage and current waveforms developed within the buck SMPC embodying the principals of the present disclosure of FIG. 3. When the load current $I_{LOAD}$ increases precipitously at the time $\tau_1$, the output voltage $V_{OUT}$ begins to fall since the duty cycle of the output of the driver circuit 50 is not large enough to support the level of the load current $I_{LOAD}$. When the output voltage $V_{OUT}$ has decreased to the undershoot threshold voltage level $V_{THUS}$ at the time $\tau_2$, the panic comparator 40 is activated and the panic voltage $V_{PANIC}$ rises to the voltage level of the logical (1). The logical (1) voltage level of the panic voltage $V_{PANIC}$ is transferred through the logical AND 115 to be logically combined with the slope signal $V_{SLOPE}$ that is the output of the slope comparator 112. The slope of the output voltage $V_{OUT}$ still remaining negative allows the panic voltage $V_{PANIC}$ to pass through the logical AND circuit 115 The panic voltage $V_{PANIC}$ is thus transferred to the logical OR circuit 30 and the driver circuit 50 to turn on the PMOS transistor P1 and turn off the NMOS transistor N1 The voltage $V_{LX}$ at the junction of the drains of the PMOS transistor P1 and the NMOS transistor N1 rises at the time $\tau_2$. This causes the current $I_{LX}$ through the inductor LX to increase.

At the time $\tau_3$, the inductor current $I_{LX}$ is equal to the load current $I_{LOAD}$ and the slope of the output voltage $V_{OUT}$ changes from negative (decreasing voltage) to positive (increasing voltage). The panic voltage $V_{PANIC}$ remains at the logical (1) level, since the output voltage $V_{OUT}$ remains less than the undershoot threshold voltage level $V_{THUS}$. With the change of the polarity of the slope of the output voltage $V_{OUT}$ and thus the feedback voltage $V_{FB}$, the slope signal $V_{SLOPE}$ from the slope comparator 112 is transferred through the inverter 113 to the logical AND 115 to be logically combined with the output $V_{PANIC}$ of panic comparator 40. The inverter 113 inverts the active state of the slope signal $V_{SLOPE}$ from the slope comparator 112 to be active as a logical (0) that will set the output of the logical AND 115 to the logical (0). Thus the PMOS transistor P1 is now turned off and the NMOS transistor N1 is turned on. The voltage $V_{LX}$ at the junction of the sources of the PMOS transistor P1 and the NMOS transistor N1 brought to a zero voltage level shortly after the time $\tau_3$. Because of the collapsing field of the inductor LX, the current $I_{LX}$ continues to flow into the inductor LX.

At the time $\tau_4$, the panic voltage $V_{PANIC}$ returns to a logical (0) as the output voltage $V_{OUT}$ increases to past the undershoot threshold voltage level $V_{THUS}$ and the panic comparator 40 is deactivated to cause the panic voltage $V_{PANIC}$ to fall to the voltage level of the logical (0). The logical (0) voltage level of the panic voltage $V_{PANIC}$ is transferred through the logical OR circuit 30 and the driver circuit 50 to turn off the PMOS transistor P1. Because of the timing of the ramp clocking signal from the ramp generator 29, the PMOS transistor P1 remains turned on past the time $\tau_4$ thus permitting the inductor current $I_{LX}$ to continue to rise until the end of the cycle of the ramp clocking signal at the time $\tau_5$. At the time $\tau_5$, the output voltage $V_{OUT}$ is now approximately equal the target reference voltage level $V_{REF}$ and no overshoot of the desired output voltage $V_{OUT}$ occurs. This eliminates or minimizes any overshoot of the output voltage $V_{OUT}$ and the control of the SMPC returns to the pulse width modulation generator 25.

Figure 5:
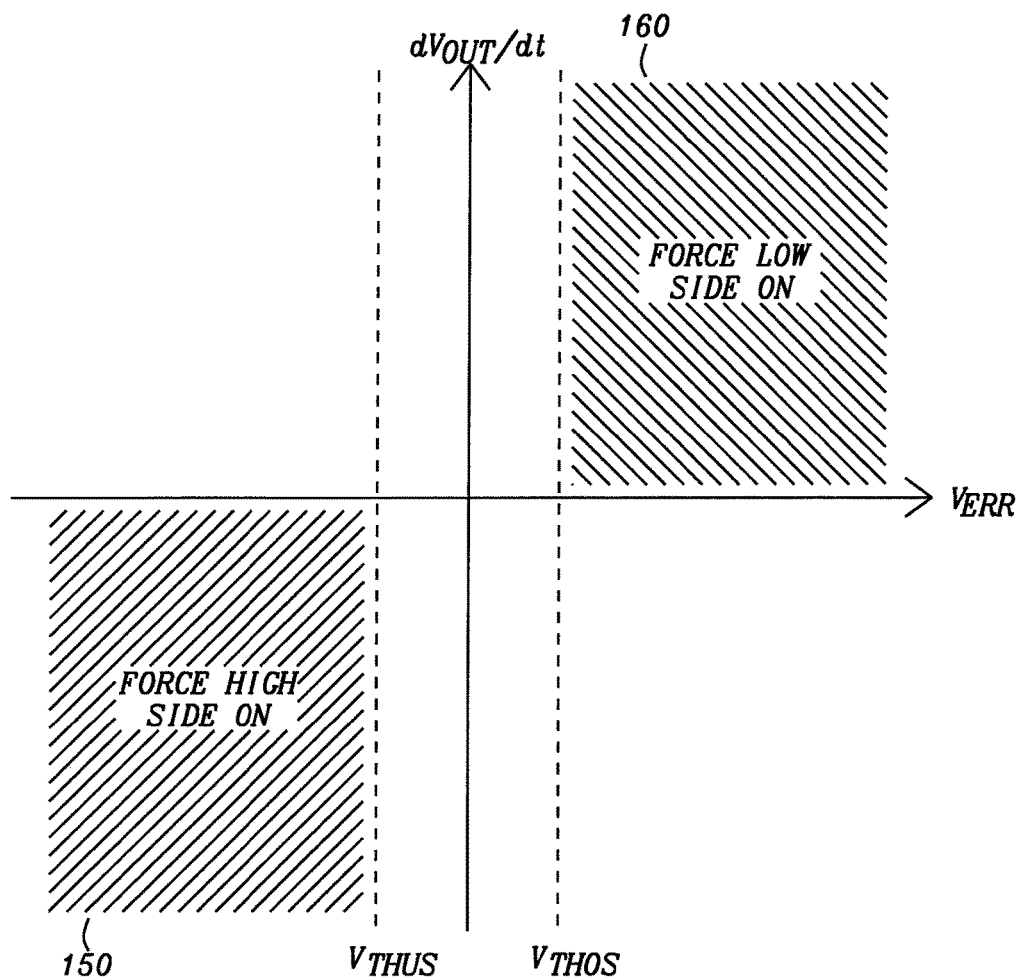
FIG. 5 is a plot of value of the slope of the output voltage of the buck SMPC of the present disclosure versus the error voltage of the buck SMPC of the present disclosure illustrating the voltage regions for the switch activations embodying the principals of this disclosure.

FIG. 5 is a plot of value of the slope of the output voltage $V_{OUT}$ of the buck SMPC of the present disclosure versus the error voltage $V_{ERR}$ of the buck SMPC of the present disclosure illustrating the voltage regions for the switch activations embodying the principals of this disclosure. In various embodiments, a buck SMPC may be connected to an electronic load 60 that not only has a very large, rapid increase in load current but a corresponding very large, rapid decrease in load current. In a situation such as this, it is desirable to eliminate or at least minimize an overshoot that is following an undershoot as described above or to eliminate or at least minimize an undershoot following an overshoot. Referring to FIG. 5, the horizontal axis is a plot of the error voltage $V_{ERR}$ at the output of the error amplifier 20 versus the slope of the change of the output voltage $V_{OUT}$ during an overshoot or undershoot. When the polarity of the slope of the output voltage $V_{OUT}$ is negative and has exceeded the undershoot threshold voltage level $V_{THUS}$, the operation of the SMPC has entered the region 150. In the region 150, the PMOS transistor P1 connected to the input power source $V_{IN}$ is turned on. The slope of the change of the output voltage $V_{OUT}$ reverses and when the slope changes direction from negative to positive, the PMOS transistor P1 is turned off and the NMOS transistor N1 that is connected to the ground reference voltage supply is turned on to prevent the overshoot following the undershoot. Conversely, when the polarity of the slope of the output voltage $V_{OUT}$ is positive and has exceeded the overshoot threshold voltage level $V_{THOS}$, the operation of the SMPC has entered the region 155. In the region 155, the NMOS transistor N1 connected to the ground reference voltage supply is turned on. The slope of the output voltage $V_{OUT}$ reverses and when the slope changes direction from positive to negative, the NMOS transistor N1 is turned off and the PMOS transistor P1 that is connected to the input power source $V_{IN}$ is turned on to prevent the undershoot following the overshoot.

Figure 6:
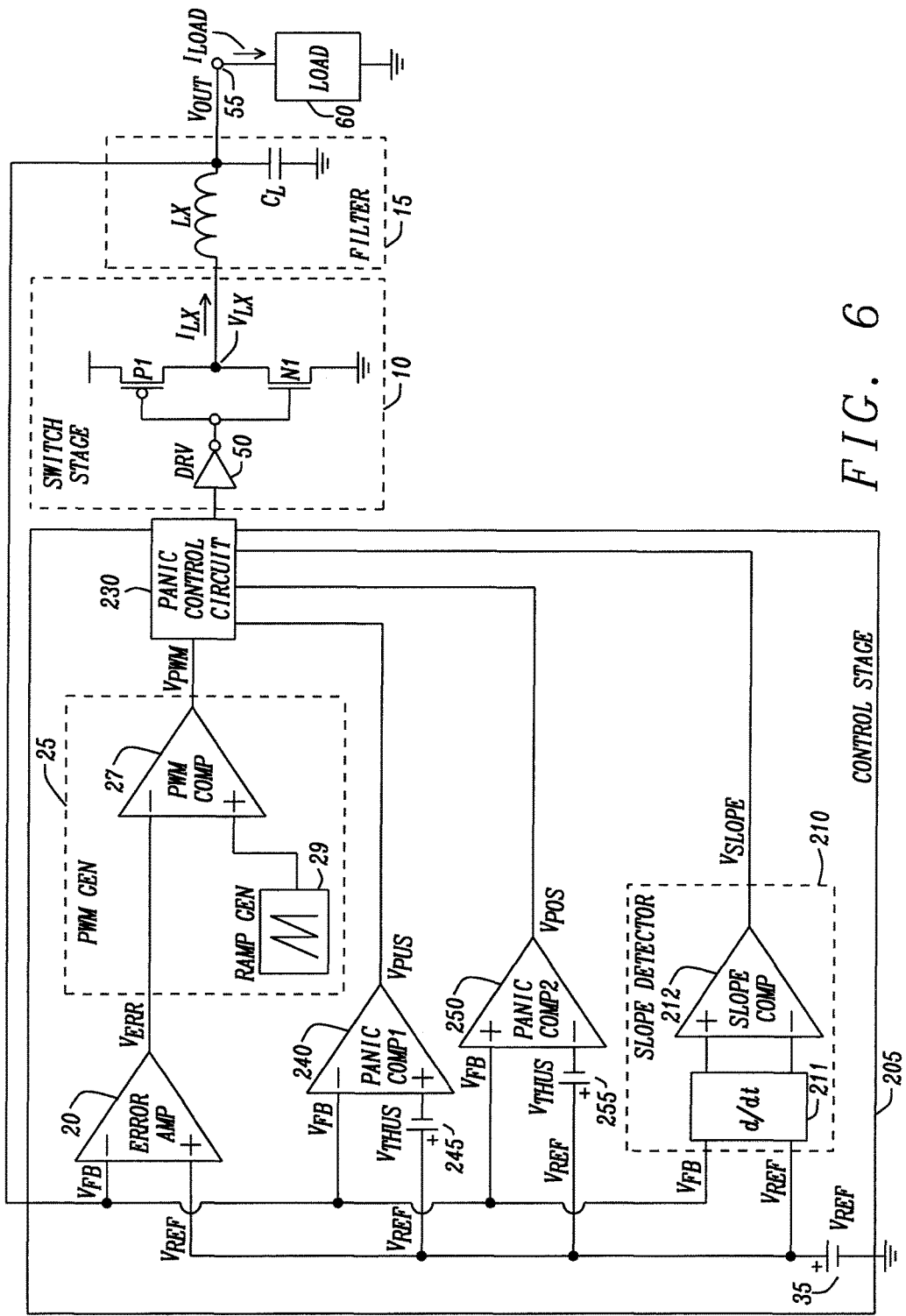
FIG. 6 is a schematic of a second implementation of a buck SMPC of the present disclosure.

The SMPC must now accomplish the elimination or at least minimization of an overshoot that is following an undershoot and the elimination or at least minimization of an undershoot following an overshoot. To accomplish this, an overshoot panic comparator is added to the SMPC of FIG. 3 to detect an overshoot due to the very large, rapid decrease in the load current $I_{LOAD}$ being used by the electronic load circuit 60. FIG. 6 is a schematic of a second implementation of a buck SMPC of the present disclosure. The buck SMPC of the second implementation has a control stage 205, a switch 10, filter 15. The switch stage 10 and the filter stage 15 are identical in structure and function as shown in FIG. 1. The control stage 205 provides the necessary signals for activating and deactivating the switch stage 10 to control the current $I_{LX}$ applied to the filter stage 15. The control stage 205 has an error amplifier 20 that is structured and functions as shown in FIG. 1. The error amplifier 20 receives a feedback voltage $V_{FB}$ indicative of the output voltage $V_{OUT}$ of the buck SMPC that receives a feedback voltage $V_{FB}$ from the output terminal 55 of the buck SMPC. A target reference voltage source 35 provides a target reference voltage $V_{REF}$ to a second input of the error amplifier 20. The difference between the feedback voltage $V_{FB}$ and the target reference voltage $V_{REF}$ is used to generate an error signal $V_{ERR}$ indicative of a difference between the output voltage $V_{OUT}$ of the SMPC and the target reference voltage $V_{REF}$. The target reference voltage $V_{REF}$ is a design voltage level for the output voltage $V_{OUT}$ of the SMPC and thus the control stage 5 is structured to minimize the error signal $V_{ERR}$.

The output of the error amplifier 20 is connected to the input of the pulse width modulation (PWM) generator section 25 that is structured and functions as shown in FIG. 1. The PWM generator section 25 includes a PWM comparator 27 and a ramp generator 29. The PWM comparator 27 receives the error signal $V_{ERR}$ at a noninverting input and a ramp clocking signal as created by the ramp generator 29 at the inverting input. The PWM comparator 27 compares the error signal $V_{ERR}$ and the ramp clocking signal and generates a digital PWM signal $V_{PWM}$ at the output of the PWM comparator 27. When error signal $V_{ERR}$ applied to the noninverting (+) input of the PWM comparator 27 is less than the ramp clocking signal applied to the inverting (−) input, the digital PWM signal $V_{PWM}$ will be logical (0). As soon as the ramp clocking signal becomes larger than the error signal $V_{ERR}$, the digital PWM signal $V_{PWM}$ will be logical (1). The ramp clocking signal generates the digital PWM signal $V_{PWM}$ that has a pulse width based on the amount of load current $I_{LOAD}$ applied to the load circuit 60. If there is a very light load current $I_{LOAD}$, the duty cycle of the digital PWM signal $V_{PWM}$ is relatively small.

If a load transient causes a significant increase in the load current $I_{LOAD}$, the digital PWM signal $V_{PWM}$ must increase its duty cycle very quickly. To assist in this, an undershoot panic comparator 240 is added to the control stage 205. The undershoot panic comparator 240 is connected to a negative terminal of the undershoot threshold voltage source 245. The positive terminal of the undershoot threshold voltage source 245 is connected to the positive terminal of the target reference voltage source 35. The combination of the undershoot voltage source 245 and the target reference voltage source 35 sets the undershoot threshold voltage level $V_{THUS}$ at the noninverting terminal (+) of the panic comparator 240 at a voltage level of the target reference voltage $V_{REF}$ less the undershoot threshold voltage level $V_{THUS}$ generated by the undershoot voltage source 245.

The inverting terminal (−) of the undershoot panic comparator 240 receives the feedback voltage $V_{FB}$ for comparison with the undershoot threshold voltage level $V_{THUS}$. The undershoot panic voltage $V_{PUS}$ of the undershoot panic comparator 240 is activated to a logical (1) when the feedback voltage $V_{FB}$ is less than the undershoot threshold voltage level $V_{THUS}$. The undershoot panic voltage $V_{PUS}$ is transferred to the panic control circuit 230 for controlling the switch stage for eliminating the overshoot occurring after the undershoot from a very large, rapid increase in the load current $I_{LOAD}$.

If a load transient causes a significant decrease in the load current $I_{LOAD}$, the digital PWM signal $V_{PWM}$ must decrease its duty cycle very quickly. To assist in this, an overshoot panic comparator 250 is added to the control stage 205. The overshoot panic comparator 250 is connected to a positive terminal (+) of the undershoot threshold voltage source 255. The negative terminal (−) of the overshoot threshold voltage source 255 is connected to the positive terminal (+) of the target reference voltage source 35. The combination of the overshoot voltage source 255 and the target reference voltage source 35 sets the overshoot threshold voltage level $V_{THOS}$ at the inverting terminal (−) of the overshoot panic comparator 250 at a voltage level of the target reference voltage $V_{REF}$ less the overshoot threshold voltage level $V_{THOS}$ generated by the overshoot voltage source 255.

The noninverting terminal (+) of the undershoot panic comparator 250 receives the feedback voltage $V_{FB}$ for comparison with the overshoot threshold voltage level $V_{THOS}$. The overshoot panic voltage $V_{POS}$ of the overshoot panic comparator 250 is activated to a logical (1) when the feedback voltage $V_{FB}$ is greater than the overshoot threshold voltage level $V_{THOS}$. The overshoot panic voltage $V_{POS}$ is transferred to the panic control circuit 230 for controlling the switch stage for eliminating the undershoot occurring after the overshoot from a very large, rapid decrease in the load current $I_{LOAD}$.

To compensate for the large overshoot following the undershoot or the large undershoot following the overshoot, the control stage 205 has a slope detector 210. The slope detector 210 has a first terminal that is connected to receive the feedback voltage $V_{FB}$ and a second terminal that is connected to receive the target reference voltage $V_{REF}$. The slope detector 210 is configured to detect when the slope of the feedback voltage $V_{FB}$ and thus the output voltage $V_{OUT}$ of the SMPC changes from a negative slope to a positive slope for the undershoot followed by the overshoot or from a positive slope to a negative for the overshoot followed by the undershoot indicating that the output voltage $V_{OUT}$ is being restored to be equal to the target reference voltage $V_{REF}$. The slope signal $V_{SLOPE}$ from the slope detector 210 is activated or deactivated as appropriate and the slope signal $V_{SLOPE}$ from the slope detector 210 is transferred to the panic control circuit 230.

The slope detector 210 has a differentiator 211 that determines a differentiation between the feedback voltage $V_{FB}$ and the target reference voltage $V_{REF}$. The differentiator 211 then creates an in-phase difference signal and an out-of-phase difference signal indicating the difference between the feedback voltage $V_{FB}$ and the target reference voltage $V_{REF}$. The in-phase and the out-of-phase difference signals are applied respectively to the in-phase terminal (+) and out-of-phase terminal (−) of the slope comparator 212. The slope signal $V_{SLOPE}$ from the slope comparator 212 is applied to the panic control circuit 230.

The panic control circuit 230 is connected for receiving the undershoot panic voltage $V_{PUS}$, the overshoot panic voltage $V_{POS}$, and the slope signal $V_{SLOPE}$. The panic control circuit 230 determines whether an undershoot or an overshoot has occurred. The slope signal $V_{SLOPE}$ is monitored to determine when the polarity of the slope of the output voltage $V_{OUT}$ is changed. Based on whether the undershoot has occurred in the output voltage $V_{OUT}$ or the overshoot has occurred in the output voltage $V_{OUT}$, the panic control circuit 230 activates its output to turn on and turn off the appropriate transistor of the switching stage 10 to supply the current $I_{LX}$ to the inductor LX or sink current the current $I_{LX}$ from the inductor LX to eliminate or minimize the overshoot following the undershoot or the undershoot following the overshoot.

The plot of FIG. 4 is exemplary of the undershoot followed by the overshoot of FIG. 6 due to a very large, rapid increase load current $I_{LOAD}$. In this case the undershoot panic voltage $V_{PANIC}$ is now designated the undershoot panic voltage $V_{PUS}$.

Figure 7:
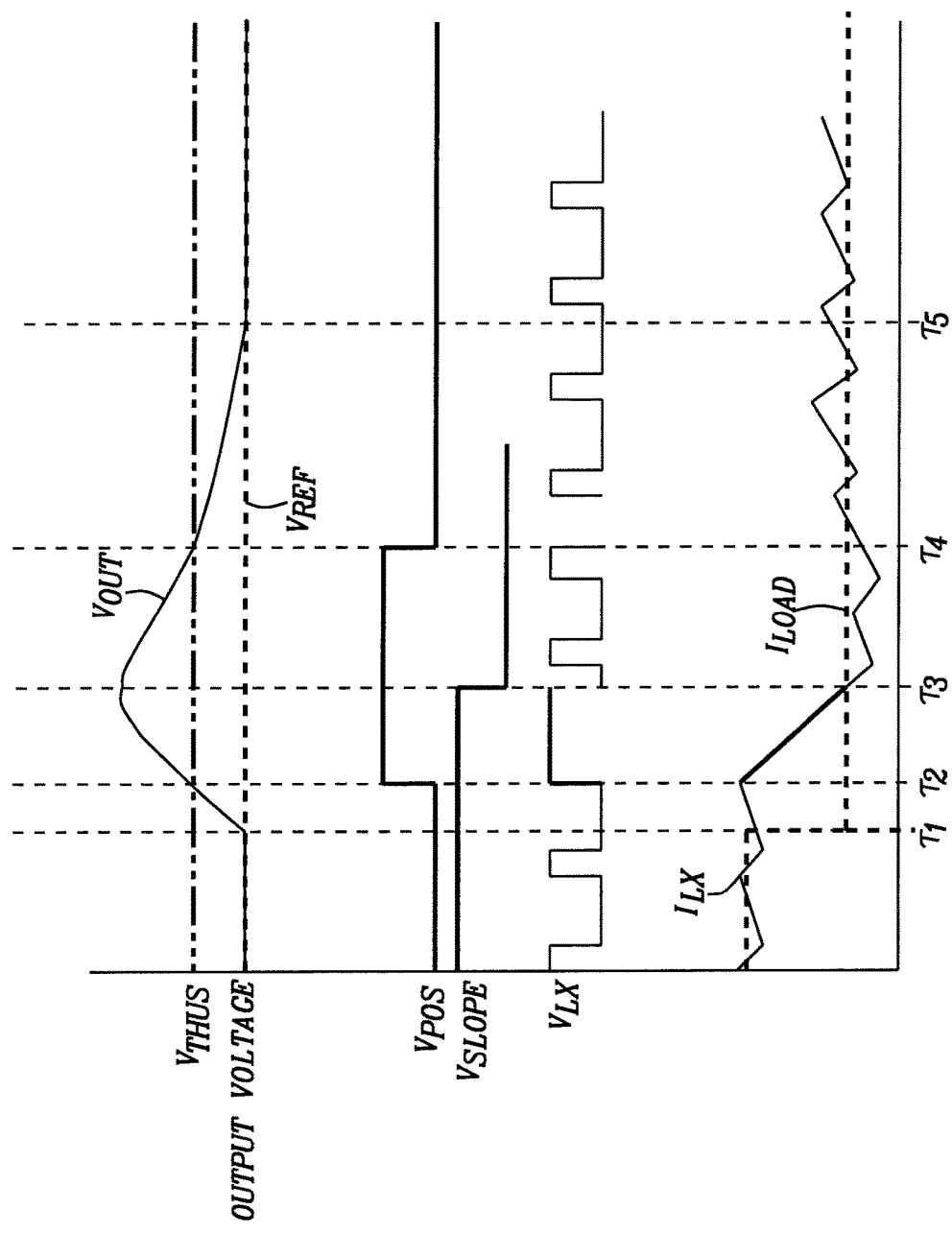
FIG. 7 is a plot of the voltage and current waveforms developed within the buck SMPC embodying the principals of the present disclosure of FIG. 6 for very large, rapid decrease in the load current.

FIG. 7 is a plot of the voltage and current waveforms developed within the buck SMPC embodying the principals of the present disclosure of FIG. 6 for very large, rapid decrease in the load current $I_{LOAD}$. When the load current $I_{LOAD}$ decreases precipitously at the time the output voltage $V_{OUT}$ begins to rise since the duty cycle of the current flowing through the inductor $I_{LX}$ is too large to support the level of the load current $I_{LOAD}$. When the output voltage $V_{OUT}$ has increased to the overshoot threshold voltage level $V_{THOS}$ at the time $\tau_2$, the overshoot panic comparator 250 is activated and the overshoot panic voltage $V_{POS}$ rises to the voltage level of the logical (1). The logical (1) voltage level of the overshoot panic voltage $V_{POS}$ is transferred to the panic control circuit 230 to be logically combined with the slope signal $V_{SLOPE}$ from the slope comparator 212. The slope of the output voltage $V_{OUT}$ still remaining positive as combined with the overshoot panic voltage $V_{POS}$ in the panic control circuit deactivates the driver circuit 50 to turn off the PMOS transistor P1 and turn on the NMOS transistor N1 The voltage $V_{LX}$ at the junction of the drains of the PMOS transistor P1 and the NMOS transistor N1 falls at the time $\tau_2$. This causes the current $I_{LX}$ through the inductor LX to decrease.

At the time $\tau_3$, the inductor current $I_{LX}$ is equal to the load current $I_{LOAD}$ and the slope of the output voltage $V_{OUT}$ changes from positive (increasing voltage) to negative (decreasing voltage). The panic voltage $V_{POS}$ remains at the logical (1) level, since the output voltage $V_{OUT}$ remains greater than the overshoot threshold voltage level $V_{THOS}$. With the change of the polarity of the slope of the output voltage $V_{OUT}$ and thus the feedback voltage $V_{FB}$, the slope signal $V_{SLOPE}$ from the slope comparator 212 is transferred to the panic control circuit 230 to be logically combined with the overshoot panic output $V_{POS}$ of the panic comparator 240. The panic control circuit 230 activates the driver 50 to turn on the PMOS transistor P1 and turn off the NMOS transistor N1. The voltage $V_{LX}$ at the junction of the sources of the PMOS transistor P1 and the NMOS transistor N1 brought to a voltage level equal to approximately the input voltage $V_{IN}$ shortly after the time $\tau_3$. Because of the expanding field of the inductor LX, the current $I_{LX}$ continues to decrease its flow into the inductor LX.

At the time $\tau_4$, the panic voltage $V_{POS}$ returns to a logical (0) as the output voltage $V_{OUT}$ decreases to past the overshoot threshold voltage level $V_{THOS}$ and the panic comparator 240 is deactivated to cause the panic voltage $V_{POS}$ to fall to the voltage level of the logical (0). The logical (0) voltage level of the panic voltage $V_{POS}$ is transferred to the panic control circuit 230. The panic control circuit 230 sets the driver circuit 50 to turn off the PMOS transistor P1 and turn on the NMOS transistor N1. Because of the timing of the ramp clocking signal from the ramp generator 29, the PMOS transistor P1 remains turned off past the time $\tau_3$ thus permitting the inductor current $I_{LX}$ to continue to fall until the end of the cycle of the ramp clocking signal at the time $\tau_4$. The PWM generator starts to take control of the pulse width modulation. At the time $\tau_5$, the output voltage $V_{OUT}$ is now approximately equal the target reference voltage level $V_{REF}$ and no overshoot of the desired output voltage $V_{OUT}$ occurs. This eliminates or minimizes any overshoot of the output voltage $V_{OUT}$ and the control of the SMPC returns to the pulse width modulation generator 25.

Figure 8:
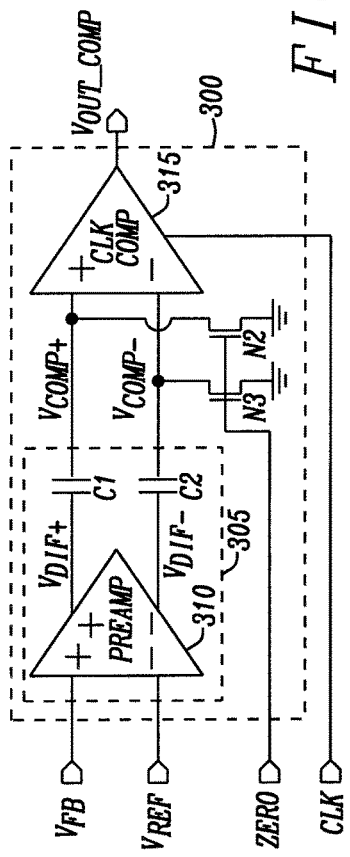
FIG. 8 is a schematic of a discrete time type slope comparator incorporated in a buck SMPC embodying the principals of this disclosure.

FIG. 8 is a schematic of a slope detector 300 that is incorporated in the embodiments 110 of FIG. 3 and 210 of FIG. 6. The slope detector 300 has a first terminal that is connected to receive the feedback voltage $V_{FB}$ and a second terminal that is connected to receive the target reference voltage $V_{REF}$. The slope detector 300 is configured to detect when the slope of the feedback voltage $V_{FB}$ and thus the output voltage $V_{OUT}$ of the SMPC changes from a negative slope to a positive slope indicating that the output voltage $V_{OUT}$ is being restored to be equal to the target reference voltage $V_{REF}$.

The slope detector 300 has a differentiator 305 that determines a difference between the feedback voltage $V_{FB}$ and the target reference voltage $V_{REF}$. The differentiator 305 then creates a differentiated noninverted and inverted difference signals $V_{COMP+}$ and $V_{COMP-}$ indicating the difference between the feedback voltage $V_{FB}$ and the target reference voltage $V_{REF}$. The differentiated noninverted and inverted difference signals $V_{COMP+}$ and $V_{COMP-}$ are applied respectively to the in-phase terminal (+) and out-of-phase terminal (−) of the slope comparator 315.

The differentiator 305 contains a preamplifier 310 and two differentiating capacitors C1 and C2. The in-phase (+) input of the preamplifier 310 is connected to receive the feedback voltage $V_{FB}$ and the out-of-phase input (−) of the preamplifier 310 is connected to receive the target reference voltage $V_{REF}$. The preamplifier 310 is configured to generate a difference signal indicating a difference between the feedback voltage $V_{FB}$ and the target reference voltage $V_{REF}$. The outputs of the preamplifier provide a noninverted output (+) and an inverted output (−) to create a differential signal pair $V_{DIF+}$ and $V_{DIF-}$ of the difference signal. The noninverted output (+) is connected to a first terminal of the first differentiating capacitor C1 and the inverted output (−) is connected to a first terminal of the second differentiating capacitor C2.

A second terminal of the first differentiating capacitor C1 is connected to the in-phase terminal (+) of the slope comparator 315 and a second terminal of the second differentiating capacitor C2 is connected to the out-of-phase terminal (−) of the slope comparator 315. The two capacitors C1 and C2 differentiate the noninverted and inverted difference signals $V_{DIF+}$ and $V_{DIF-}$ to provide the differentiated noninverted and inverted difference signals $V_{COMP+}$ and $V_{COMP-}$. The differentiated noninverted difference signal $V_{COMP+}$ is applied to the in-phase terminal (+) of the slope comparator 315. The differentiated inverted difference signal $V_{COMP-}$ is applied to the out-of-phase terminal (−) of the slope comparator 315. The slope comparator 315 in various embodiments is a clocked comparator. A clocked comparator is known in the art as having a clock signal CLK applied to the comparator 315 for strobing the comparator for establishing the state of the comparison based upon the arrival of the clock signal CLK. The rising edge of the clock signal CLK determines the sampling of the comparison that will be applied to the output terminal of the clocked slope comparator 315. The clock signal has a sufficiently high frequency that change in polarity of the slope of the output voltage $V_{OUT}$ is determined with relative accuracy.

The slope detector 300 has an in-phase zeroing transistor N2 and an out-of-phase zeroing transistor N3. The in-phase zeroing transistor N2 has a drain connected to the junction of the second terminal of the first capacitor C1 and the in-phase terminal (+) of the slope comparator 315. The out-of-phase zeroing transistor N3 has a drain connected to the junction of the second terminal of the second capacitor C2 and the out-of-phase terminal (−) of the slope comparator 315. The sources of the in-phase zeroing transistor N2 and the out-of-phase zeroing transistor N3 are connected to the ground reference source. The gates of the in-phase zeroing transistor N2 and the out-of-phase zeroing transistor N3 are connected to receive a zero set signal $V_{ZERO}$. When the zero set signal $V_{ZERO}$ is activated to turn on the in-phase zeroing transistor N2 and the out-of-phase zeroing transistor N3, the in-phase terminal (+) and the out-of-phase terminal (−) of the slope comparator 315 are set to the ground reference voltage and the output of the slope comparator 315 is brought to a zero level.

Figure 9:
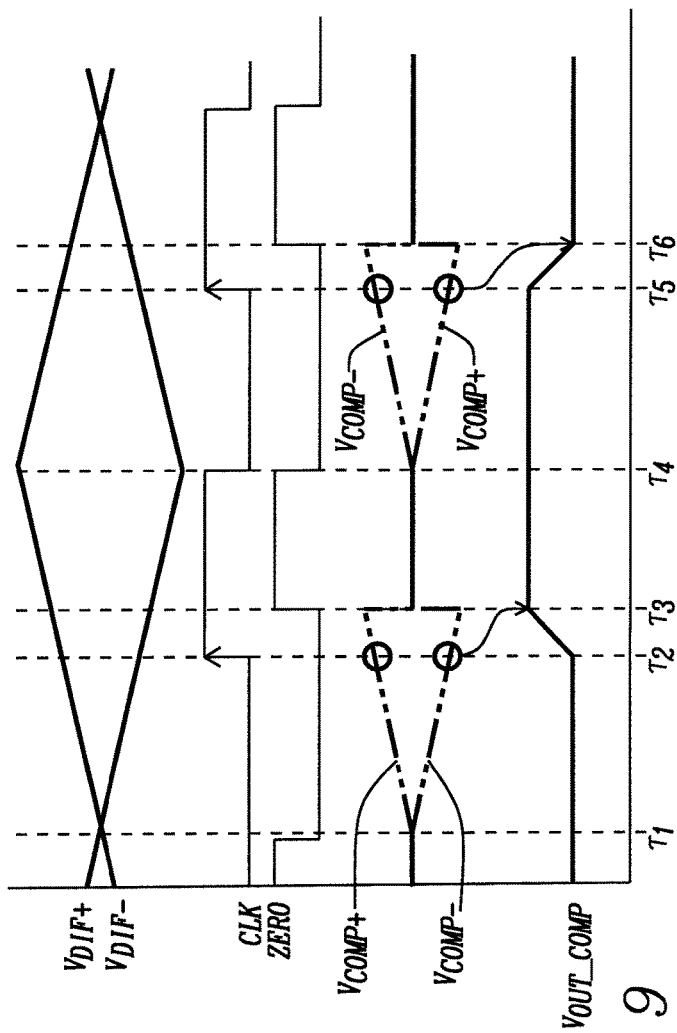
FIG. 9 is a plot of the signals present in the discrete time type slope comparator of FIG. 8 as incorporated in the buck SMPC embodying the principals of this disclosure.

FIG. 9 is a plot of the signals present in the slope comparator of FIG. 8 as incorporated in the buck SMPC embodying the principals of this disclosure. At the time $\tau_1$, the feedback voltage $V_{FB}$ is approximately equal to the target reference voltage $V_{REF}$ such that the noninverted and inverted difference signals $V_{DIF+}$ and $V_{DIF-}$ are equal. The active edge of the clock signal CLK has not arrived and the zero set signal $V_{ZERO}$ is set to deactivate the in-phase zeroing transistor N2 and the out-of-phase zeroing transistor N3. As the voltage difference between the feedback voltage $V_{FB}$ the target reference voltage $V_{REF}$ indicating an undershoot, spread between the noninverted and inverted difference signals $V_{DIF+}$ and $V_{DIF-}$ increases between the time $\tau_1$ and the time $\tau_2$. Similarly, the differentiated noninverted and inverted difference signals $V_{COMP+}$ and $V_{COMP-}$ are also increasing in the time between the time $\tau_1$ and the time $\tau_2$. At the time $\tau_2$, the clock signal CLK is activated to capture the comparison of the differentiated noninverted and inverted difference signals $V_{COMP+}$ and $V_{COMP-}$. The output $V_{OUT\_COMP}$ of the slope comparator 315 begins to rise between the time $\tau_2$ and the time $\tau_3$ from the a logical zero level (0) to logical one level (1). At the time $\tau_3$, the zero set signal $V_{ZERO}$ is activated to turn on the in-phase zeroing transistor N2 and the out-of-phase zeroing transistor N3 to connect the in-phase terminal (+) and the out-of-phase terminal (−) of the slope comparator 315 to the ground reference source.

At the time $\tau_4$, the difference between the feedback voltage $V_{FB}$ begins to decrease the target reference voltage $V_{REF}$ such that the noninverted and inverted difference signals $V_{DIF+}$ and $V_{DIF-}$ decreases between the time $\tau_4$ and the time $\tau_5$. At the time $\tau_5$, the clock signal CLK is activated to capture the comparison of the differentiated noninverted and inverted difference signals $V_{COMP+}$ and $V_{COMP-}$. The differentiated noninverted difference signals $V_{COMP+}$ is now less than the differentiated inverted difference signals $V_{COMP-}$ and the output $V_{OUT\_COMP}$ of the slope comparator 315 begins to fall between the time $\tau_5$ and the time $\tau_6$ from the a logical one level (1) to logical zero level (0). At the time $\tau_6$, the zero set signal $V_{ZERO}$ is activated to turn on the in-phase zeroing transistor N2 and the out-of-phase zeroing transistor N3 to connect the in-phase terminal (+) and the out-of-phase terminal (−) of the slope comparator 315 to the ground reference source. When the output $V_{OUT\_COMP}$ of the slope comparator 315 is at the logical one level (1), the slope of the output voltage $V_{OUT}$ of the SMPC is positive. When the output $V_{OUT\_COMP}$ of the slope comparator 315 is at the logical zero level (0), the slope of the output voltage $V_{OUT}$ of the SMPC is negative.

Figure 10:
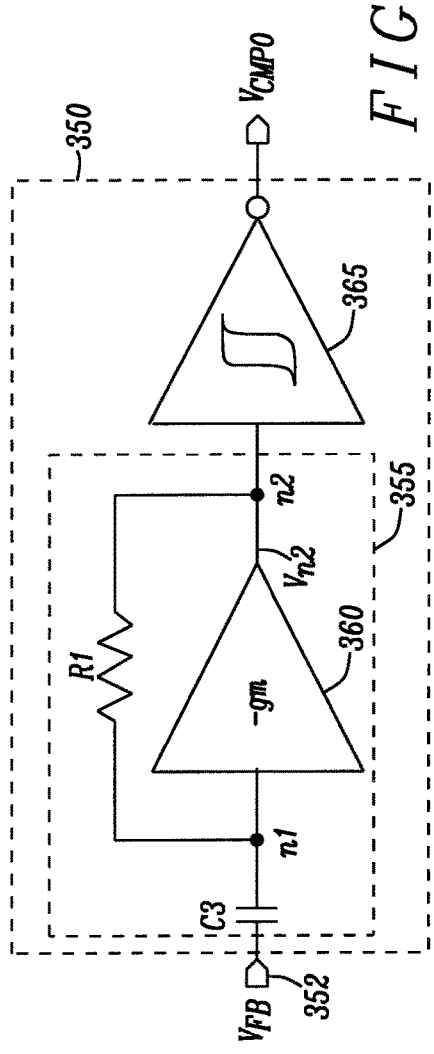
FIG. 10 is a schematic of continuous discrete time type slope comparator incorporated in a buck SMPC embodying the principals of this disclosure.

FIG. 10 is a schematic of a continuous time type slope comparator 350 incorporated in a buck SMPC embodying the principals of this disclosure. An input terminal 352 of the discrete time type slope comparator 350 is connected to an input $n_1$ of the differentiator 305 for receiving the feedback voltage $V_{FB}$ that is in response to the output voltage $V_{OUT}$. The feedback voltage $V_{FB}$ is applied to first terminal of the differentiating capacitor $C_3$. A second terminal of the differentiating capacitor $C_3$ is connected to the input $n_1$ of the transconductance amplifier 360 and to the first terminal of the resistor $R_1$. The output $n_2$ of the transconductance amplifier 360 is connected to the input of the Schmitt Trigger or hysteresis comparator 365 and to the second terminal of the resistor $R_1$.

Input $n_1$ to the transconductance amplifier 360 is a virtual ground. Therefore, the input current $I_{IN}$ flows from the feedback voltage $V_{FB}$ as it responds to the output voltage $V_{OUT}$ to the input $n_1$ of the transconductance amplifier 360 through differentiating capacitor $C_1$. The input current $I_{IN}$ is determined by the equation:

$$I_{IN}=C1*d(V_{OUT})/dt.$$

The input current $I_{IN}$ current is changed in the transconductance amplifier 360 such that the output $n_2$ of the transconductance amplifier 360 provides a voltage $V_{n2}$. The voltage $V_{N2}$ is determined by the equation:

$$Vn2=I_{IN}*R_1+V_{OFFSET}=C_1*R_1*d(V_{FB})/dt+V_{OFFSET}.$$

Therefore the output voltage $V_{n2}$ of the transconductance amplifier 360 is a linear function of the derivative of output voltage $V_{OUT}$. The comparator 365 is able to determine the polarity of the slope of any variation in the output voltage $V_{OUT}$.

Figure 11:
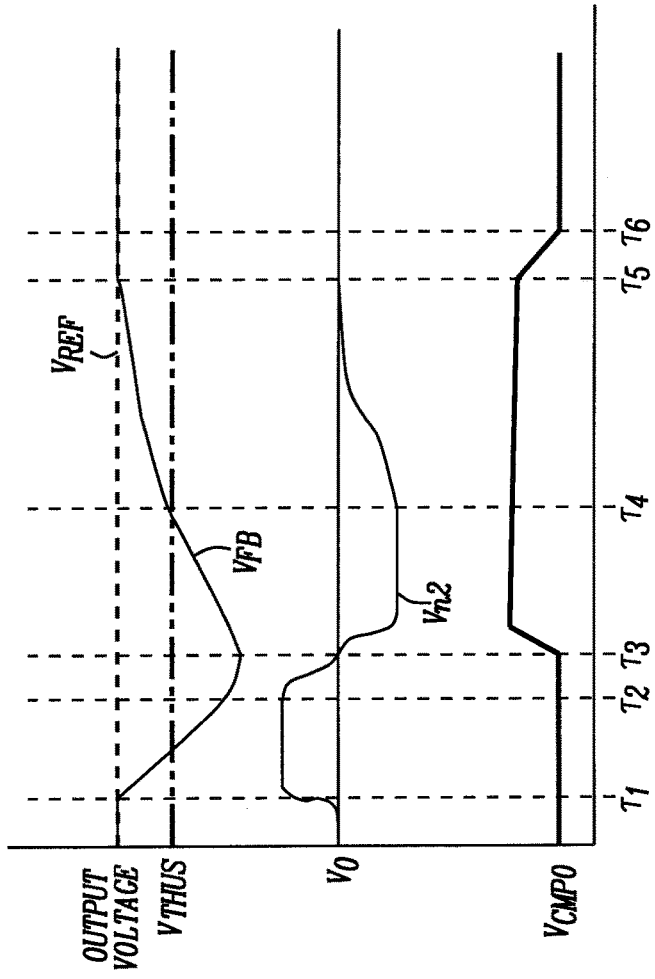
FIG. 11 is a plot of the signals present in the continuous time type slope comparator of FIG. 8 as incorporated in the buck SMPC embodying the principals of this disclosure.
Figure 12:
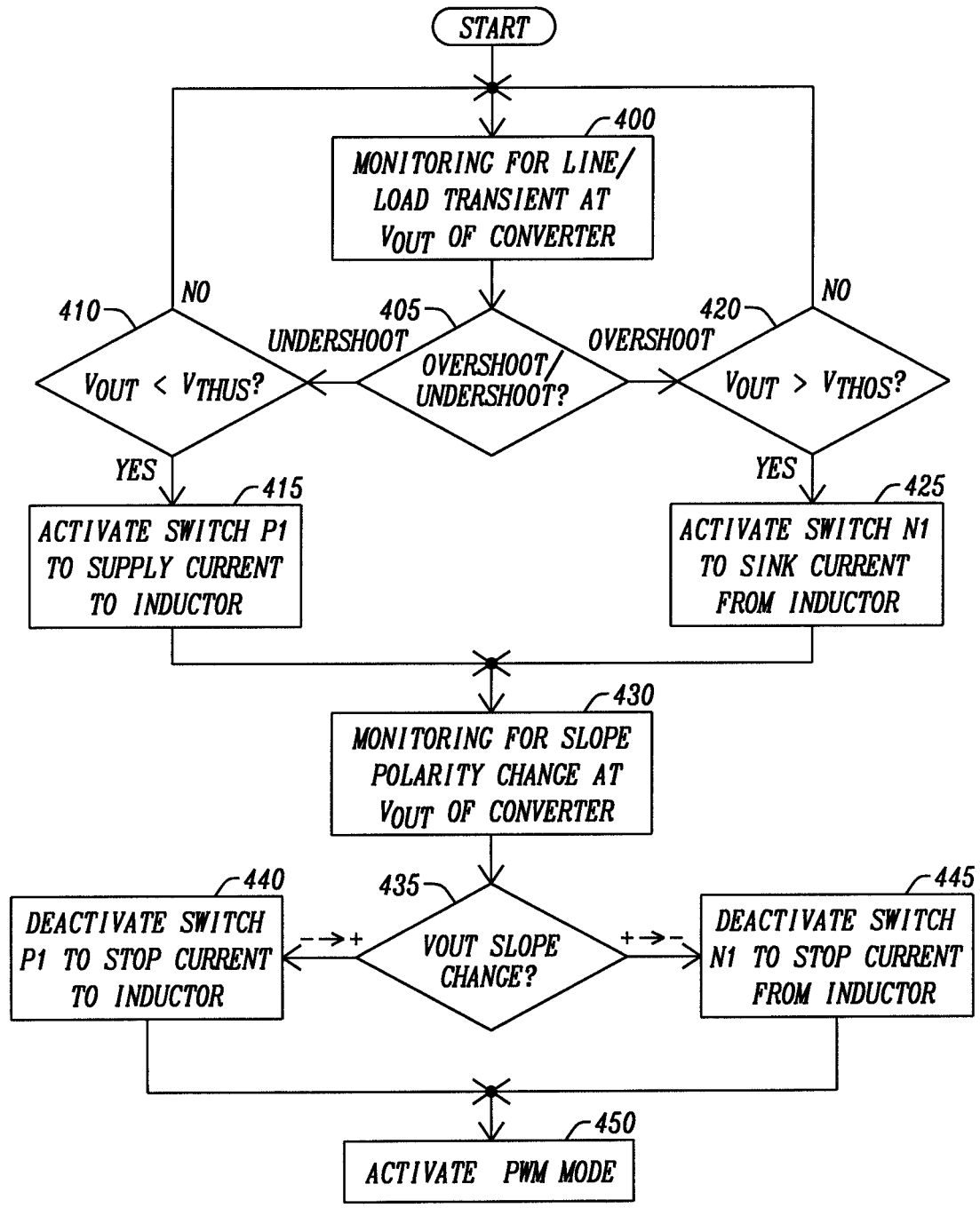
FIG. 12 is a flowchart of a method for operating a buck SMPC embodying the principals of this disclosure.

FIG. 11 is a plot of the signals present in the continuous time type slope comparator of FIG. 8 as incorporated in the buck SMPC embodying the principals of this disclosure. When the load current $I_{LOAD}$ increases precipitously at the time $\tau_1$, the output voltage $V_{OUT}$ begins to fall and the feedback voltage $V_{FB}$ responds accordingly. At the time $\tau_1$ the begins to be equal to the magnitude of the slope of the feedback voltage $V_{FB}$ and remains at that magnitude until the slope of the feedback voltage $V_{FB}$ begins to decrease with a less negative slope at the time $\tau_2$. When the output voltage $V_{OUT}$ has decreased to the undershoot threshold voltage level $V_{THUS}$ at the time $\tau_2$, the panic comparator 40 is activated and the driver circuit 50 is activated to turn on the PMOS transistor P1 and turn off the NMOS transistor N1 The voltage $V_{LX}$ at the junction of the drains of the PMOS transistor P1 and the NMOS transistor N1 rises at the time $\tau_2$. This causes the current $I_{LX}$ through the inductor LX to increase, with the polarity of the slope of the output voltage $V_{OUT}$ remaining negative.

At the time $\tau_3$, the slope of the output voltage $V_{OUT}$ is set to a zero slope change and shortly thereafter changes from negative (decreasing voltage) to positive (increasing voltage). The transconductance amplifier 360 output voltage $V_{n2}$ begins to fall until it crosses the zero slope amplitude $V_0$ at the time $\tau_3$.

At the time $\tau_4$, output voltage $V_{OUT}$ passes the undershoot threshold voltage level $V_{THUS}$, the panic voltage $V_{PANIC}$ returns to a logical (0) and the driver circuit 50 turns off the PMOS transistor P1. Because of the timing of the ramp clocking signal from the ramp generator 29, the PMOS transistor P1 remains turned on past the time $\tau_4$ thus permitting the inductor current $I_{LX}$ to continue to rise until the end of the cycle of the ramp clocking signal at the time $\tau_5$. The transconductance amplifier 360 output voltage $V_{n2}$ remains negative indicating a positive slope until the time $\tau_5$. At the time $\tau_5$, the output voltage $V_{OUT}$ is now approximately equal the target reference voltage level $V_{REF}$ and no overshoot of the desired output voltage $V_{OUT}$ occurs and the transconductance amplifier 360 output voltage $V_{n2}$ begins to fall until it crosses the zero slope amplitude $V_0$. This eliminates or minimizes any overshoot of the output voltage $V_{OUT}$ and the control of the SMPC returns to the pulse width modulation generator 25.

FIG. 10 is a flowchart of a method for operating a buck SMPC embodying the principals of this disclosure. The method is started by monitoring (Box 400) output voltage of the SMPC for a load transient indicating a very large, rapid change in the output voltage. A transient detector determines (Box 405) if the very large, rapid change is an overshoot or an undershoot of the output voltage. If the very large, rapid change is an undershoot, the output voltage $V_{OUT}$ is compared (Box 410) to the undershoot threshold voltage level $V_{THUS}$. If the output voltage $V_{OUT}$ is less than the undershoot threshold voltage level $V_{THUS}$, the monitoring (Box 400) for the load transient indicating a very large, rapid change in the output voltage is resumed. If the output voltage $V_{OUT}$ is less than the undershoot threshold voltage level $V_{THUS}$, the switch stage is activated (Box 405) to supply current to the inductor and thus to the load. In the embodiments of FIGS. 3 and 6 the PMOS transistor P1 is activated to source the current from the input voltage source $V_{IN}$.

If the very large, rapid change is an overshoot, the output voltage $V_{OUT}$ is compared (Box 420) to the overshoot threshold voltage level $V_{THOS}$. If the output voltage $V_{OUT}$ is less than the overshoot threshold voltage level $V_{THOS}$, the monitoring (Box 400) for the load transient indicating a very large, rapid change in the output voltage is resumed. If the output voltage $V_{OUT}$ is greater than the overshoot threshold voltage level $V_{THOS}$, the switch stage is activated (Box 425) to sink current from the inductor and thus from the load. In the embodiments of FIGS. 3 and 6 the NMOS transistor N1 is activated to sink the current from the inductor and thus from the load.

Upon the activation (Box 405 and 425) of the switch stage for source or sinking current from the inductor and thus the load, the polarity of the slope of the output voltage $V_{OUT}$ of the SMPC is monitored (Box 430). When a monitoring (Box 430) of the slope of the output voltage $V_{OUT}$ determines a change in the polarity, the slope change is determined (Box 435). If the slope is changed from a negative slope to a positive slope, the switch stage is deactivated (Box 440) to stop the current flow to the inductor. If the slope is changed from a positive slope to a negative slope, the switch stage is deactivated (Box 445) to stop the current flow from the inductor. At the deactivation (Box 440 and 445) of the switching stage, the SMPC will be activated (Box 450) to operate in the pulse width modulation mode.

It should be noted that the examples of this disclosure are shown as buck SMPC's. However, other configurations of a SMPC are equally applicable, such a boost converter, buck-boost converter, and other variations of the SMPC.

While this disclosure has been particularly shown and described with reference to the preferred embodiments thereof, it will be understood by those skilled in the art that various changes in form and details may be made without departing from the spirit and scope of the disclosure.

What is claimed is:

1. A control circuit for controlling overshoot and/or undershoot of the output voltage of a switch mode power converter (SMPC) in response to very large and rapid load current increase or decrease comprising:
    at least one load variation detector connected for sensing a large and rapid increase or decrease in load current at an output of the SMPC comprising:
        a first input terminal connected for receiving a feedback signal indicative of an output voltage of the SMPC,
        a second input terminal is connected for receiving a variation limit threshold reference voltage,
        a comparator for comparing the feedback signal with the variation limit threshold reference voltage to determine that a large, rapid load current increase or decrease has occurred and generates a panic voltage when the feedback signal exceeds the variation limit threshold reference, and
        an output terminal connected to receive the panic voltage from the comparator for communication to a switch stage of the SMPC such that when the feedback signal has exceeded the variation limit threshold reference voltage, the panic voltage commands the switch stage to activate for sourcing current through or sinking current from a filter stage of the SMPC and thus to or from the load circuit to compensate to the large, rapid load current variation; and
    a slope detector connected for receiving the feedback signal and the target reference voltage and configured for creating a slope signal indicative of a slope of the output voltage determined from difference of the feedback signal and a target reference voltage and configured for determining when the slope of the output voltage changes polarity and generating a slope polarity signal for activating the switch stage for preventing an overshoot or undershoot of the output voltage of the SMPC once the large and rapid current transient has been compensated.

2. The control circuit of claim 1 wherein one load variation detector is a load increase detector connected for sensing the large and rapid increase in load current at an output of the SMPC, the variation limit threshold reference voltage is an undershoot threshold target reference voltage, and when the feedback signal has exceeded the undershoot threshold target reference voltage, the switch stage is activated to provide current through filter stage of the SMPC to the load circuit to compensate to the large, rapid load current increase.

3. The control circuit of claim 2 wherein one load variation detectors is a load decrease detector connected for sensing the large and rapid decrease in load current at an output of the SMPC, the variation limit threshold reference voltage is an overshoot threshold target reference voltage, and when the feedback signal has exceeded the overshoot threshold target reference voltage, the switch stage is activated to sink current from the filter stage of the SMPC from the load circuit to compensate to the large, rapid load current decrease.

4. The control circuit of claim 1 wherein the slope detector comprises:
    a differentiator connected for receiving the feedback signal and the target reference voltage and configured for creating the slope signal from the feedback signal and a target reference voltage and configured for amplifying and generating in-phase and out-of-phase slope signals;
    a slope comparator in communication with the differentiator for receiving the in-phase and out-of-phase slope signals at an in-phase input and an out-of-phase input and configured for comparing the in-phase and out-of-phase slope signals for determining which of the in-phase and out-of-phase slope signals is greater and generating the slope polarity signal when the slope of the output voltage changes polarity as determined by which of the in-phase and out-of-phase slope signals is greater.

5. The control circuit of claim 4 wherein the differentiator comprises:
    a preamplifier connected for receiving the feedback signal and the target reference voltage and configured for generating a difference signal indicating the difference between the feedback signal and the target reference voltage and configured for amplifying and generating the in-phase difference signal and the out-of-phase difference signal;
    a first capacitor comprising:
        a first terminal connected to the preamplifier for receiving the in-phase difference signal, and
        a second terminal connected to an in-phase input terminal of the slope comparator for transferring the in-phase slope signal to the slope comparator;
    a second capacitor comprising:
        a first terminal connected to the preamplifier for receiving the out-of-phase difference signal, and
        a second terminal connected to an out-of-phase input terminal of the slope comparator for transferring the out-of-phase slope signal to the slope comparator;
    wherein the first capacitor and the second capacitor are configured for differentiating the in-phase difference signal and the out-of-phase difference signal for generating the in-phase slope signal and the out-of-phase slope signal.

6. The control circuit of claim 5 wherein the slope comparator is configured for determining the change in polarity of the slope of the output voltage by comparing the in-phase slope signal with the out-of-phase slope signal;
    wherein when the in-phase slope signal is greater than the out-of-phase slope signal, the slope polarity signal indicates that the slope is positive;
    wherein when the out-of-phase slope signal is greater than the in-phase slope signal, the slope polarity signal indicates that the slope is negative;
    wherein when the slope polarity signal changes states, the slope polarity signal, as transferred to the switch stage, activates the switch stage to cause the current source to or sink from the inductor and thus the load to cease any undershoot or overshoot and a normal pulse width modulation to resume.

7. The control circuit of claim 6 wherein the slope comparator is a clocked comparator connected for receiving a clock signal for capturing and latching the state of the in-phase and out-of-phase slope polarity signals at specific clock intervals configured for transferring the slope polarity signal indicating the polarity of the slope of the output voltage at the specific clock intervals.

8. The control circuit of claim 7 wherein the slope detector further comprises:
    a first zeroing transistor with a drain connected to a junction between the second terminal of the first capacitor and the in-phase input of the slope comparator, a gate connected for receiving a zeroing signal, and a source connected to a ground reference voltage source;

a second zeroing transistor with a drain connected to a junction between the second terminal of the second capacitor and the out-of-phase input of the slope comparator, a gate connected for receiving a zeroing signal, and a source connected to a ground reference voltage source;

wherein when the very large rapid variation in the load current occurs and the state of the in-phase and out-of-phase slope polarity signals are latched at the specific clock intervals, the zeroing signal is activated to turn on the first and second zeroing transistors to set the in-phase input and out-of-phase input of the slope comparators to the ground reference voltage source.

9. The control circuit of claim 6 wherein when the slope detector detects a negative slope with the undershoot and the switch stage is activated to source current to the load, the change in the difference between the feedback signal and the target reference voltage begins to decrease until the slope becomes positive at which time, the slope detector detects the positive slope and the slope signal is activated to indicate the positive slope and the switch stage is then deactivated from providing current to the load circuit and control stage sets a pulse width modulation operating condition.

10. The control circuit of claim 6 wherein when the slope detector detects a positive slope with the overshoot and the switch stage is activated to sink current from the load, the change in the difference between the feedback signal and the target reference voltage begins to decrease until the slope becomes negative at which time, the slope detector detects negative slope and the slope signal is activated to indicate the negative slope and the switch stage is then deactivated from sinking current to the load circuit and control stage sets a pulse width modulation operating condition.

11. The control circuit of claim 1 wherein the slope detector comprises:

a differentiator connected for receiving the feedback signal and configured for creating a slope signal from the feedback signal wherein the amplitude of the slope signal is indicative of a slope of the output voltage; and a comparator in communication with the differentiator for receiving slope signal at an input and configured for determining when the slope of the output voltage changes polarity based on the amplitude of slope signal and whether it is greater than or less than a zero slope voltage level and based on the amplitude of the slope signal generating a slope polarity signal.

12. The control circuit of claim 11 wherein the differentiator comprises:

a differentiating capacitor having a first terminal connected to receive the feedback signal;

a transconductance amplifier having an input terminal connected to a second terminal of the differentiating capacitor for receiving an input current proportional to the differentiation of the feedback signal versus time and the transconductance amplifier is configured for transforming the input current to slope signal at an output terminal; and a feedback resistor having a first terminal connected to the output of the transconductance amplifier and a second terminal connected to the second terminal of the differentiating capacitor and the input terminal of the transconductance amplifier for determining the amplitude of the slope signal based on the input current.

13. The control circuit of claim 11 wherein the comparator is connected to receive the slope signal from the differentiator comparator and is configured as a Schmitt trigger circuit such that the comparator determines when the slope signal and thus the slope of the feedback signal is positive or negative relative to the zero slope voltage level and generates the slope polarity signal.

14. The control circuit of claim 1 further comprising a logical control gate that is connected for receiving at least one panic voltage from the at least one load variation detector, the slope polarity signal from the slope detector provides a indicating a change in polarity of the slope of the large and rapid current transient, and the pulse width modulation signal from a pulse width modulator within the control circuit and the logical control gate is configured for is logically combining the at least panic voltage, the slope polarity signal, and the pulse width modulation signal for controlling the switching stage of the SMPC.

15. The control circuit of claim 3 further comprising a panic control circuit connected for receiving the undershoot panic voltage from the load increase detector, the overshoot panic voltage from the load decrease detector, and slope polarity signal the slope detector and configured for determining the activation and deactivation of the switch stage to control the flow of current into and out of the filter stage of the SMPC.

16. A switch mode power converter (SMPC) comprising:

a control circuit configured for controlling overshoot and/or undershoot of the output voltage of the SMPC in response to very large and rapid load current transient, wherein the control circuit comprises:

at least one load variation detector connected for sensing a large and rapid increase or decrease in load current at an output of the SMPC comprising:

a first input terminal connected for receiving a feedback signal indicative of an output voltage of the SMPC, a second input terminal is connected for receiving a variation limit threshold reference voltage, a comparator for comparing the feedback signal with the variation limit threshold reference voltage to determine that a large, rapid load current increase or decrease has occurred and generates a panic voltage when the feedback signal exceeds the variation limit threshold reference voltage, and an output terminal connected to receive the panic voltage from the comparator for communication to a switch stage of the SMPC such that when the feedback signal has exceeded the variation limit threshold reference voltage, the panic voltage commands the switch stage to activate for sourcing current through or sinking current from a filter stage of the SMPC and thus to or from the load circuit to compensate to the large, rapid load current variation; and a slope detector connected for receiving the feedback signal and the target reference voltage and configured for creating a slope signal indicative of a slope of the output voltage determined from the difference of the feedback signal and a target reference voltage and configured for determining when the slope of the output voltage changes polarity and generating a slope polarity signal for activating the switch stage for preventing an overshoot or undershoot of the output voltage of the SMPC once the large and rapid current transient has been compensated.

17. The switch mode power converter of claim 16 wherein one load variation detector is a load increase detector connected for sensing the large and rapid increase in load current at an output of the SMPC, the variation limit threshold reference voltage is an undershoot threshold target reference voltage, and when the feedback signal has exceeded the undershoot threshold target reference voltage, the switch stage is activated to provide current through filter stage of the SMPC to the load circuit to compensate to the large, rapid load current increase.

18. The switch mode power converter of claim 17 wherein one load variation detectors is a load decrease detector connected for sensing the large and rapid decrease in load current at an output of the SMPC, the variation limit threshold reference voltage is an overshoot threshold target reference voltage, and when the feedback signal has exceeded the overshoot threshold target reference voltage, the switch stage is activated to sink current from the filter stage of the SMPC from the load circuit to compensate to the large, rapid load current decrease.

19. The switch mode power converter of claim 16 wherein the slope detector comprises:
- a differentiator connected for receiving the feedback signal and the target reference voltage and configured for creating the slope signal from the feedback signal and the target reference voltage and configured for amplifying and generating in-phase and out-of-phase slope signals;
- a slope comparator in communication with the differentiator for receiving the in-phase and out-of-phase slope signals at an in-phase input and an out-of-phase input and configured for comparing the in-phase and out-of-phase slope signals for determining which of the in-phase and out-of-phase slope signals is greater and generating a slope polarity signal when the slope of the output voltage changes polarity as determined by which of the in-phase and out-of-phase slope signals is greater.

20. The switch mode power converter of claim 19 wherein the differentiator comprises:
- a preamplifier connected for receiving the feedback signal and the target reference voltage and configured for generating a difference signal indicating the difference between the feedback signal and the target reference voltage and configured for amplifying and generating the in-phase difference signal and the out-of-phase difference signal;
- a first capacitor comprising:
  - a first terminal connected to the preamplifier for receiving the in-phase difference signal, and
  - a second terminal connected to an in-phase input terminal of the slope comparator for transferring the in-phase slope signal to the slope comparator;
- a second capacitor comprising:
  - a first terminal connected to the preamplifier for receiving the out-of-phase difference signal, and
  - a second terminal connected to an out-of-phase input terminal of the slope comparator for transferring the out-of-phase slope signal to the slope comparator;
- wherein the first capacitor and the second capacitor are configured for differentiating the in-phase difference signal and the out-of-phase difference signal for generating the in-phase slope signal and the out-of-phase slope signal.

21. The switch mode power converter of claim 20 wherein the slope comparator is configured for determining the change in polarity of the slope of the output voltage by comparing the in-phase slope signal with the out-of-phase slope signal;
- wherein when the in-phase slope signal is greater than the out-of-phase slope signal, the slope polarity signal indicates that the slope is positive;
- wherein when the out-of-phase slope signal is greater than the in-phase slope signal, the slope polarity signal indicates that the slope is negative;
- wherein when the slope polarity signal changes states, the slope polarity signal, as transferred to the switch stage, activates the switch stage to cause the current source to or sink from the inductor and thus the load to cease any undershoot or overshoot and a normal pulse width modulation to resume.

22. The switch mode power converter of claim 21 wherein the slope comparator is a clocked comparator connected for receiving a clock signal for capturing and latching the state of the in-phase and out-of-phase slope polarity signals at specific clock intervals configured for transferring the slope polarity signal indicating the polarity of the slope of the output voltage at the specific clock intervals.

23. The switch mode power converter of claim 22 wherein the slope detector further comprises:
- a first zeroing transistor with a drain connected to a junction between the second terminal of the first capacitor and the in-phase input of the slope comparator, a gate connected for receiving a zeroing signal, and a source connected to a ground reference voltage source;
- a second zeroing transistor with a drain connected to a junction between the second terminal of the second capacitor and the out-of-phase input of the slope comparator, a gate connected for receiving a zeroing signal, and a source connected to a ground reference voltage source;
- wherein when the very large rapid variation in the load current occurs and the state of the in-phase and out-of-phase slope polarity signals are latched at the specific clock intervals, the zeroing signal is activated to turn on the first and second zeroing transistors to set the in-phase input and out-of-phase input of the slope comparators to the ground reference voltage source.

24. The switch mode power converter of claim 21 wherein when the slope detector detects a negative slope with the undershoot and the switch stage is activated to source current to the load, the change in the difference between the feedback signal and the target reference voltage begins to decrease until the slope becomes positive at which time, the slope detector detects the positive slope and the slope signal is activated to indicate the positive slope and the switch stage is then deactivated from providing current to the load circuit and control stage sets a pulse width modulation operating condition.

25. The switch mode power converter of claim 21 wherein when the slope detector detects a positive slope with the overshoot and the switch stage is activated to sink current from the load, the change in the difference between the feedback signal and the target reference voltage begins to decrease until the slope becomes negative at which time, the slope detector detects negative slope and the slope signal is activated to indicate the negative slope and the switch stage is then deactivated from sinking current to the load circuit and control stage sets a pulse width modulation operating condition.

26. The switch mode power converter of claim 16 wherein the slope detector comprises:

a differentiator connected for receiving the feedback signal and configured for creating a slope signal from the feedback signal wherein the amplitude of the slope signal is indicative of a slope of the output voltage; and a comparator in communication with the differentiator for receiving slope signal at an input and configured for determining when the slope of the output voltage changes polarity based on the amplitude of slope signal and whether it is greater than or less than a zero slope voltage level and based on the amplitude of the slope signal generating a slope polarity signal.

27. The switch mode power converter of claim 26 wherein the differentiator comprises:

a differentiating capacitor having a first terminal connected to receive the feedback signal;

a transconductance amplifier having an input terminal connected to a second terminal of the differentiating capacitor for receiving an input current proportional to the differential of the feedback signal versus time and the transconductance amplifier is configured for transforming the input current to slope signal at an output terminal; and a feedback resistor having a first terminal connected to the output of the transconductance amplifier and a second terminal connected to the second terminal of the differentiating capacitor and the input terminal of the transconductance amplifier for determining the amplitude of the slope signal based on the input current.

28. The switch mode power converter of claim 26 wherein the comparator is connected to receive the slope signal from the differentiator comparator and is configured as a Schmitt trigger circuit such that the comparator determines when the slope signal and thus the slope of the feedback signal is positive or negative relative to the zero slope voltage level and generates the slope polarity signal.

29. The switch mode power converter of claim 16 wherein the control circuit further comprises a logical control gate that is connected for receiving at least one panic voltage from the at least one load variation detector, the slope polarity signal from the slope detector provides a indicating a change in polarity of the slope of the large and rapid current transient, and the pulse width modulation signal from a pulse width modulator within the control circuit and the logical control gate is configured for is logically combining the at least panic voltage, the slope polarity signal, and the pulse width modulation signal for controlling the switching stage of the SMPC.

30. The switch mode power converter of claim 18 wherein the control circuit further comprises a panic control circuit connected for receiving the undershoot panic voltage from the load increase detector, the overshoot panic voltage from the load decrease detector, and slope polarity signal the slope detector and configured for determining the activation and deactivation of the switch stage to control the flow of current into and out of the filter stage of the SMPC.

31. A method for operating a switch mode power converter (SMPC) comprises the steps of:

monitoring for a very large, rapid load current increase or decrease in a load current flowing from an output terminal of the SMPC;

determining a type of very large, rapid load current increase or decrease, when the very large, rapid load current increase or decrease in a load current occurs;

comparing an amplitude of an output voltage of the SMPC with an undershoot threshold voltage; when the very large, rapid load current increase or decrease is an increase in the load current;

activating a switching stage of the SMPC for supplying current to the load circuit, when the output is lesser than undershoot threshold voltage;

comparing an amplitude of an output voltage of the SMPC with an overshoot threshold voltage; when the very large, rapid load current increase or decrease is a decrease in the load current;

activating a switching stage of the SMPC for sinking current from the load circuit, when the output is greater than overshoot threshold voltage;

monitoring a polarity of the slope of a change in the output voltage during the very large, rapid load current increase or decrease;

evaluating the change in the slope for determining that a change in polarity of the slope of the change in the output voltage has occurred;

deactivating the first switch in the switch stage to stop additional current from flowing to the load circuit to prevent an overshoot, when the changes in polarity of the slope of the change in the output voltage is from negative to positive;

deactivating the second switch in the switch stage to stop additional current from flowing from load circuit to prevent an undershoot, when the changes in polarity of the slope of the change in the output voltage is from positive to negative; and activating a normal pulse width modulation operation of the SMPC.

32. The method of claim 31 wherein the very large, rapid load current increase causes an undershoot in the output voltage of the SMPC as applied to the load circuit.

33. The method of claim 31 wherein the very large, rapid load current decrease causes an overshoot in the output voltage of the SMPC as applied to the load circuit.

* * * * *